(12) United States Patent
Shiraishi

(10) Patent No.: US 8,134,483 B2
(45) Date of Patent: Mar. 13, 2012

(54) DATA PROCESSING APPARATUS AND METHOD

(75) Inventor: Naoto Shiraishi, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 45 days.

(21) Appl. No.: 12/805,910

(22) Filed: Aug. 24, 2010

(65) Prior Publication Data

US 2011/0063143 A1     Mar. 17, 2011

(30) Foreign Application Priority Data

Sep. 15, 2009  (JP) ................................. 2009-213802

(51) Int. Cl.
   H03M 7/34       (2006.01)
(52) U.S. Cl. ............................................ 341/51; 341/87
(58) Field of Classification Search ................ 341/51, 341/50, 87; 358/1.9, 426.01, 426.04, 518; 382/232, 239, 163; 710/9, 29, 53, 58, 71
   See application file for complete search history.

(56) References Cited

U.S. PATENT DOCUMENTS 7,245,396 B2 * 7/2007 Sakamoto ................... 358/1.9

FOREIGN PATENT DOCUMENTS

| JP | 2713369 B | 3/1991 |
| JP | 3730385 B | 6/1999 |
| JP | 3610381 B | 12/2000 |
| JP | 4000266 B2 | 9/2003 |
| JP | 3922386 B2 | 5/2006 |
| WO | WO-03096544 A1 | 11/2003 |

OTHER PUBLICATIONS

English language abstract for JP-2003-264703-A (which corresponds to JP-4000266-B2).
English language abstract for WO-2003096544-A1 (which corresponds to JP-3922386-B2).
English language abstract for JP-03-068219-A (which corresponds to JP-2713369-B).
English language abstract for JP-11-168389-A (which corresponds to JP-3730385-B).
English language abstract for JP-2000-339138 (which corresponds to JP-3610381-B).

\* cited by examiner

*Primary Examiner* — Joseph Lauture
(74) *Attorney, Agent, or Firm* — Harness, Dickey & Pierce, PLC

(57) ABSTRACT

An apparatus includes: a storage storing data input and sliding stored data per input; first and second comparators comparing in parallel the input data with each stored data and obtaining a position of data matching the input data; first and second determiners each determining whether a stored data matches the input data; a holder holding the result by the first or second comparator; a generator generating a value representing the position; a generator obtaining a longest length of a matching data list of the stored data that match the input data compared by the second comparator and that is at positions consecutive over each input, and generating a value representing the length; a generator generating a value using the input data as is; and a generator generating a code including these values. The comparison by the second comparator is controlled based on the result by the first or second comparator.

9 Claims, 17 Drawing Sheets

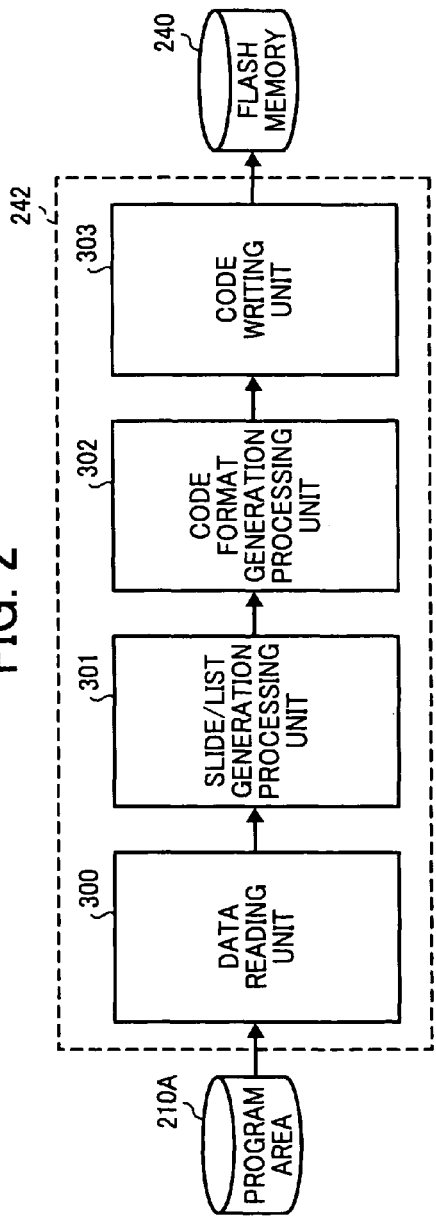
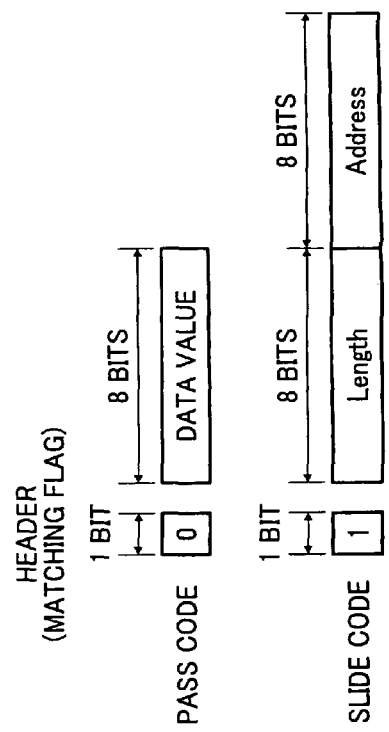

FIG. 5A

SLIDE SEARCH

SLIDE STORAGE UNIT: #15 #14 #13 #12 #11 #10 #9 #8 #7 #6 #5 #4 #3 #2 #1 #0 INPUT DATA

| a | c | a | c | b | d | c | b | a | c | b | a | a | c | b | a | ← a |

R FLAG: RFLG15 RFLG14 RFLG13 RFLG12 RFLG11 RFLG10 RFLG9 RFLG8 RFLG7 RFLG6 RFLG5 RFLG4 RFLG3 RFLG2 RFLG1 RFLG0

LIST SEARCH

SLIDE STORAGE UNIT: #15 #14 #13 #12 #11 #10 #9 #8 #7 #6 #5 #4 #3 #2 #1 #0 INPUT DATA

| c | a | c | b | d | c | b | a | c | b | a | a | c | b | a | a | ← c |

R FLAG: RFLG15 ... RFLG0

1 0 1 0 0 0 0 0 1 0 0 1 1 0 0 1   Length: 0

W FLAG: WFLG15 ... WFLG0

LIST SEARCH

SLIDE STORAGE UNIT: #15 c | #14 b | #13 d | #12 c | #11 b | #10 a | #9 c | #8 b | #7 a | #6 a | #5 c | #4 b | #3 a | #2 a | #1 c | #0 b ← INPUT DATA d

R FLAG: RFLG15 [0] RFLG14 [0] RFLG13 [1] RFLG12 [0] RFLG11 [0] RFLG10 [0] RFLG9 [0] RFLG8 [0] RFLG7 [1] RFLG6 [0] RFLG5 [0] RFLG4 [0] RFLG3 [1] RFLG2 [0] RFLG1 [0] RFLG0 [0]  Length 2

W FLAG: WFLG15 [0] WFLG14 [0] WFLG13 [1] WFLG12 [0] WFLG11 [0] WFLG10 [0] WFLG9 [0] WFLG8 [0] WFLG7 [0] WFLG6 [0] WFLG5 [0] WFLG4 [0] WFLG3 [0] WFLG2 [0] WFLG1 [0] WFLG0 [0]

FIG. 6E

LIST SEARCH

SLIDE STORAGE UNIT: #15 b | #14 d | #13 c | #12 b | #11 a | #10 c | #9 b | #8 a | #7 a | #6 c | #5 b | #4 a | #3 c | #2 c | #1 b | #0 d ← INPUT DATA a

R FLAG: [0][0][1][0][0][0][0][0][0][0][0][0][0][0][0][0]  Length 3

W FLAG: [0][0][0][0][0][0][0][0][0][0][0][0][0][0][0][0]

FIG. 6F

SLIDE SEARCH

SLIDE STORAGE UNIT: #15 b | #14 d | #13 c | #12 b | #11 a | #10 c | #9 b | #8 a | #7 a | #6 c | #5 b | #4 a | #3 c | #2 c | #1 b | #0 d ← INPUT DATA a

R FLAG: [0][0][0][0][1][0][0][1][1][0][0][1][1][0][0][0]

FIG. 6G

LIST SEARCH

SLIDE STORAGE UNIT: #15 #14 #13 #12 #11 #10 #9 #8 #7 #6 #5 #4 #3 #2 #1 #0 INPUT DATA
| d | c | b | a | c | b | a | a | c | b | a | a | c | b | d | a | ← f |

R FLAG: RFLG 15, RFLG 14, RFLG 13, RFLG 12, RFLG 11, RFLG 10, RFLG 9, RFLG 8, RFLG 7, RFLG 6, RFLG 5, RFLG 4, RFLG 3, RFLG 2, RFLG 1, RFLG 0
| 0 | 0 | 0 | 0 | 1 | 0 | 0 | 1 | 1 | 0 | 0 | 1 | 1 | 0 | 0 | 0 |  Length 0

W FLAG: WFLG 15, WFLG 14, WFLG 13, WFLG 12, WFLG 11, WFLG 10, WFLG 9, WFLG 8, WFLG 7, WFLG 6, WFLG 5, WFLG 4, WFLG 3, WFLG 2, WFLG 1, WFLG 0
| 0 | 0 | 0 | 0 | 0 | 0 | 0 | 0 | 0 | 0 | 0 | 0 | 0 | 0 | 0 | 0 |

FIG. 6H

SLIDE SEARCH

SLIDE STORAGE UNIT: #15 #14 #13 #12 #11 #10 #9 #8 #7 #6 #5 #4 #3 #2 #1 #0 INPUT DATA
| d | c | b | a | c | b | a | a | c | b | a | a | c | b | d | a | ← f |

R FLAG: RFLG 15, RFLG 14, RFLG 13, RFLG 12, RFLG 11, RFLG 10, RFLG 9, RFLG 8, RFLG 7, RFLG 6, RFLG 5, RFLG 4, RFLG 3, RFLG 2, RFLG 1, RFLG 0
| 0 | 0 | 0 | 0 | 0 | 0 | 0 | 0 | 0 | 0 | 0 | 0 | 0 | 0 | 0 | 0 |  PASS CODE f

DATA PROCESSING APPARATUS AND METHOD

CROSS-REFERENCE TO RELATED APPLICATIONS

The present application claims priority to and incorporates by reference the entire contents of Japanese Patent Application No. 2009-213802 filed in Japan on Sep. 15, 2009.

BACKGROUND OF THE INVENTION

1. Field of the Invention

The present invention relates to a data processing apparatus for and a data processing method of performing lossless compression encoding of data.

2. Description of the Related Art

Run length encoding (RLE) is one of data compression algorithms and classified as lossless compression. In the run length encoding, consecutive data are encoded by expressing a datum and a number of times the datum continues to compress the continuous data.

For example, a data string "AAAAABBBBBBBBBAAA" is expressible as a data string "A5B9A3" after encoding. This means that "A" continues 5 times, "B" continues 9 times, and then "A" continues 3 times. In this example, a number of times that a datum continues is disposed behind the datum. Alternatively, the number of times that the datum continues may be disposed first and the number of that data may be disposed after the number. In the latter case, the data string of the encoded data is expressed as "5A9B3A."

In the above-described example, if it is determined beforehand that there are only two types of data, "A" and "B," and that the datum "A" comes first, the above data string is expressible as only "593." When following this rule, if the datum "B" is found first, it may be considered that the datum "A" continues zero time first. For example, a data string "BBBAAAABBBBBAAA" is expressible as "03553" after encoding.

As a method of efficiently compressing data, a method of compressing by universal coding has been put into practical use. Universal coding is a lossless data compression method and is applicable to various types of data (for example, character code and object code) since a statistical nature of an information source is not presupposed beforehand upon data compression.

A representative universal coding method is Ziv-Lempel coding. As Ziv-Lempel coding, two algorithms of a universal type and an incremental parsing type have been proposed. One practical method using the universal type algorithm is Lempel-Ziv-Storer-Syzmanski (LZSS) coding. Another practical method using the incremental parsing type algorithm is Lempel-Ziv-Welch (LZW) coding.

In an encoding algorithm of LZ77 coding, which becomes the basis of LZSS coding, encoding data are divided into strings of a maximum length matching from an arbitrary position of a past data string and these are encoded as a duplicate of the past data string.

More specifically, a moving window that stores encoded input data and a lookahead buffer that stores data to be encoded are provided, and a data string of the lookahead buffer is compared with all partial strings of a data string of the moving window to obtain a matching partial string of a maximum length in the moving window. In order to designate this partial string of the maximum length in the moving window, a set of "a start position of the partial string of the maximum length," "a matching length," and "a next symbol that yields a mismatch" is encoded.

Next, the encoded data string in the lookahead buffer is moved to the moving window, and a new data string, which corresponds to the encoded data string, is input to the lookahead buffer. Thereafter, the same processing is repeated, so that data is decomposed into partial data strings and encoded.

Generally, in LZSS coding, since it is necessary to detect a longest match with an input data string as many times as the number of the moving windows that store the encoded input data, it is said that an amount of computation is increased but a high compression ratio is achieved.

Further, in an encoding algorithm of LZW coding, a rewritable dictionary is installed, input character strings are sorted into different character strings, and the character strings are designated with numbers in the order they appear and registered into the dictionary. Further, a currently input character string is represented by only a dictionary number of a longest matching character string registered in the dictionary. Compared to LZSS coding, this LZW coding is lower in its compression ratio, but is simpler, easier in its computation, and higher speed processing is possible. Thus, it is widely used in file compression in a storage apparatus or in data transmission.

In the above LZ77 coding, it takes the longest time in searching for the longest matching character string at the time of encoding. Thus, in order to speed up LZ77 coding, it is necessary to speed up the search for the longest matching character string.

Japanese Patent No. 2713369 discloses a two-byte hash method, by a combination of a hash method and a linked list, of obtaining a matching position of two characters, comparing one character by one character for a match of three characters or more, and finally detecting a longest matching position.

Further, as a technique of speeding up hardware processing, Japanese Patent No. 3610381 discloses a structure including an input first in first out (FIFO) 600, a slide FIFO 601, and a search circuit 602 that has as many comparators as the size of the slide as illustrated in FIG. 15. In this structure, the search circuit 602 compares plural data stored in the input FIFO 600 with plural past input data stored in the slide FIFO 601 in parallel and sequentially detects both a longest matching position and a matching length at the same time.

Further, Japanese Patent No. 3730385 discloses a data compression apparatus having a comparator in a place where correlation is likely to occur (for example, directly above or left) in a limited manner, such that a hardware load when having as many comparators as the number of moving windows in parallel is reduced, and processing speed and hardware scale are taken into consideration.

Moreover, Japanese Patent No. 4000266 proposes a method of performing a run length encoding on an index value matching the dictionary by performing Move to Front (MTF) control on a small dynamic dictionary.

Furthermore, Japanese Patent No. 3922386 discloses a technique of obtaining a matching length by comparing plural data at once using a parallel comparing unit.

However, in the above method of Japanese Patent No. 2713369 using the combination of the hash method and the linked list, a two-character 16-bit hash requires a hash table of about 64,000 words. This is effective for software but requires a large capacity for hardware. Consequently, when Japanese Patent No. 2713369 is implemented with small-scale hardware, for example a third character and characters thereafter are compared one character by one character, and thus processing takes time.

Further, in Japanese Patent No. 4000266 performing MTF control using a small dictionary, if the number of words registered in the dictionary is small, for example, if one word is one byte and a depth of the dictionary is 64 words, even if there is a match, 8 bits are just converted to 6 bits. Accordingly, it is necessary to increase the number of words registered in the dictionary, but in that case, it becomes difficult for a match with the dictionary to occur.

In Japanese Patent No. 4000266, in order to solve this, period detection is performed and the number of words of the dictionary is obtained through the period detection as illustrated in FIG. 5. To perform this period detection, a two-pass method or a pipeline-processing on period detection and on an encoding process using a work memory need to be used.

In the two-pass method, processing is divided into two stages: a period detection process and an encoding process. The period detection process is first performed on data to be encoded, and then the encoding process is performed on the data to be encoded using the obtained period. Therefore, the processing takes extra time. Even in the method using the work memory, a large memory area for the pipeline processing of the period detection and the encoding processes is required.

In Japanese Patent No. 3730385, the number of comparators is reducible since the comparators are provided only at places where correlation is likely to occur. However, because plural line memories need to be provided, the hardware scale increases.

Furthermore, in Japanese Patent No. 3610381, the same number of circuits for obtaining a matching length as the number of slides need to be prepared as illustrated in FIG. 9 of the Patent, and the same number of circuits for comparing data as the number of the input FIFOs need to be prepared as illustrated in FIG. 10 of the Patent. Accordingly, a relatively small-scale structure having, for example, a slide length of 32 and 8 input FIFOs is easily implementable, but to increase the compression ratio, a slide length of, for example, 256 or more is required, increasing the scale.

Further, in Japanese Patent No. 3610381, the input FIFO 11 or the slide FIFO must perform shifting of a plurality of data at once based on a matching length. If this process is implemented by hardware, the structure becomes complex. That is, the non-regular shift process or comparison process for the matching length makes the whole hardware complicated. Therefore, in the configuration of Japanese Patent No. 3610381, it is difficult to improve the compression ratio by increasing the number of slides.

Further, in Japanese Patent No. 3610381, in order to obtain the longest matching position and length between the slide and the input data, two kinds of processes, a slide search and a list search, need to be performed. That is, the entire slide is first searched by the slide search, and thereafter the process is switched to the list search of searching from a plurality of matched lists based on the search result of the slide search. When the input data does not match the list, the longest matching length until that time is obtained, and the slide search starts again with that input data.

As described above, in Japanese Patent No. 3610381, when the process is switched to the slide search as no match is obtained in the list search, clock encoding is not performed for a period of at least one clock, and this decreases the processing speed.

Moreover, in Japanese Patent No. 3922386, the processing speed is increased by comparing a plurality of data at once using a matrix array 704 in which a history buffer composed of a latch 700 and a latch 701 and a comparing unit 703, which compares the plurality of data input to an input buffer 702 in a direction perpendicular to the history buffer, are arranged in a matrix of a history buffer length and an input buffer length as illustrated in FIG. 16.

However, in the method of Japanese Patent No. 3922386, the number of data processible at once is limited to the number of data determined by a configuration of the parallel comparing unit. In the example of FIG. 16, the number of data processible in parallel is limited to 12 according to the input byte length of the input buffer 702 of 12 bytes. The number of data processible at once may be increased by increasing the scale of the parallel comparing unit, but this increases the hardware scale and causes restrictions upon installing the hardware in, for example, an ASIC.

SUMMARY OF THE INVENTION

It is an object of the present invention to at least partially solve the problems in the conventional technology.

According to an aspect of the present invention, a data processing apparatus includes: a slide storage unit that sequentially stores input data input from a first terminal of the slide storage unit and sequentially slides stored data toward a second terminal of the slide storage unit upon each input; a first comparing unit that compares the input data input from the first terminal with each of the stored data in the slide storage unit in parallel and obtains a position of matching data of the stored data in the slide storage unit that matches the input data; a first determining unit that determines whether or not at least one of the stored data in the slide storage unit matches the input data compared by the first comparing unit based on a result of the comparison by the first comparing unit; a second comparing unit that compares the input data input from the first terminal with each of the stored data in the slide storage unit in parallel and obtains a position of matching data of the stored data in the slide storage unit that matches the input data; a second determining unit that determines whether or not at least one of the stored data in the slide storage unit matches the input data compared by the second comparing unit based on a result of the comparison by the second comparing unit; a holding unit that holds the result of the comparison by the first or second comparing unit based on results of the determinations by the first and the second determining units; an address value generating unit that generates an address value representing the position of the matching data based on the result of the comparison by the first or second comparing unit that is held by the holding unit according to the result of the determination by the second determining unit; a length value generating unit that obtains a longest length of a matching data list of the store data in the slide storage unit that match the input data compared by the second comparing unit and that is at positions in the slide storage unit consecutive over each input of the input data to the slide storage unit, and generates a length value representing the longest length, according to the result of the determination by the second determining unit; a data value generating unit that generates a data value that uses the input data as is according to the results of the determinations by the first and second determining units; and a code generating unit that generates a code including the address value, the length value, and the data value, wherein the comparison by the second comparing unit of comparing each of the stored data in the slide storage unit with the input data input from the first terminal is controlled based on the result of the comparison by the first or second comparing unit held in the holding unit.

According to another aspect of the present invention, a data processing method includes: first comparing of comparing input data input from a first terminal of a slide storage unit that sequentially stores the input data and sequentially slides stored data toward a second terminal of the slide storage unit upon each input, with each of the stored data in the slide storage unit in parallel and obtaining a position of matching data in the slide storage unit that matches the input data; first determining of determining whether or not at least one of the stored data in the slide storage unit matches the input data compared in the first comparing based on a result of the comparison in the first comparing; second comparing of comparing the input data input from the first terminal of the slide storage unit with each of the stored data in the slide storage unit in parallel and obtaining a position of matching data in the slide storage unit that matches the input data; second determining of determining whether or not at least one of the stored data in the slide storage unit matches the input data compared in the second comparing based on a result of the comparison in the second comparing; holding the result of the comparison in the first or second comparing in a holding unit, based on results of the determinations in the first determining and the second determining; generating an address value representing the position of the matching data based on the result of the comparison by the first or second comparing held in the holding unit according to the result of the determination in the second determining; obtaining a longest length of a matching data list of the stored data in the slide storage unit that match the input data compared in the second comparing and that is at positions in the slide storage unit consecutive over each input of the input data to the slide storage unit, and generating a length value representing the longest length, according to the result of the determination in the second determining; generating a data value that uses the input data as is according to the results of the determinations in the first determining and the second determining; and generating a code including the address value, the length value, and the data value, wherein the comparing of each of the stored data in the slide storage unit with the input data input from the first terminal of the slide storage unit is controlled based on the result of the comparison in the first or second comparing held in the holding unit.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 2 is a block diagram illustrating an example of a configuration of an encoder;

FIG. 3 illustrates an example of a code format;

FIG. 5A illustrates a flag process in a slide search process and a list search process;

FIG. 5B illustrates a flag process in a slide search process and a list search process;

FIG. 6D illustrates a slide search process and a list search process when a flag process is performed;

FIG. 6E illustrates a slide search process and a list search process when a flag process is performed;

FIG. 6F illustrates a slide search process and a list search process when a flag process is performed;

FIG. 6G illustrates a slide search process and a list search process when a flag process is performed;

FIG. 6H illustrates a slide search process and a list search process when a flag process is performed;

DETAILED DESCRIPTION OF THE PREFERRED EMBODIMENTS

Figure 1:
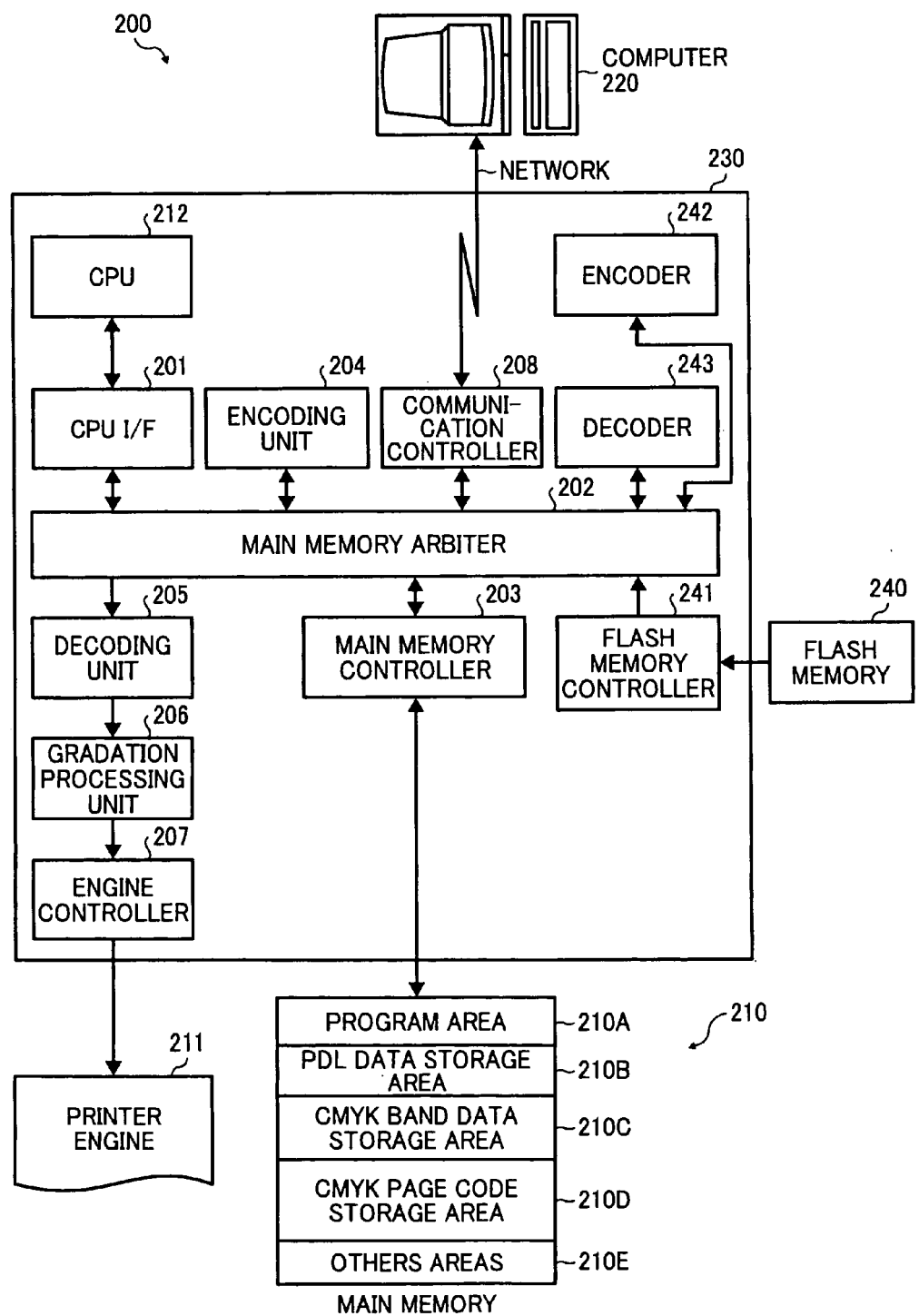
FIG. 1 is a block diagram illustrating an example of a configuration of a printer device to which a data processing apparatus according to the present invention is applicable.

Hereinafter, an embodiment of a data processing apparatus according to the present invention will be described in detail with reference to the accompanying drawings. FIG. 1 illustrates an example of a configuration of a printer device 200 to which a data processing apparatus according to the present invention is applicable. In the example of FIG. 1, the printer device 200 includes a control unit 230, a main memory 210, a printer engine 211, and a flash memory 240 that is a non-volatile memory. The flash memory 240 may be built in or removably attached to the printer device 200.

The control unit 230 includes a central processing unit (CPU) 212, a CPU I/F 201, a main memory arbiter 202, a main memory controller 203, an encoding unit 204, a decoding unit 205, a gradation processing unit 206, an engine controller 207, a flash memory controller 241, an encoder 242, and a decoder 243.

The CPU 212 controls an overall operation of the printer device 200 by a program stored in the main memory 210. The CPU 212 is connected to the main memory arbiter 202 via the CPU I/F 201. The main memory arbiter 202 arbitrates accesses by the CPU 212, the encoding unit 204, the decoding unit 205, a communication controller 208, the flash memory controller 241, the encoder 242, and the decoder 243 with respect to the main memory 210.

The main memory 210 is connected to the main memory arbiter 202 via the main memory controller 203. The main memory controller 203 controls access to the main memory 210.

The main memory 210 has a program area 210A, a page description language (PDL) data storage area 210B, a CMYK band data storage area 210C, a CMYK page code storage area 210D, and another area or other areas 210E. A program executed by the CPU 212 is stored in the program area 210A. PDL data supplied from, for example a computer 220 is stored in the PDL data storage area 210B. CMYK band data is stored in the CMYK band data storage area 210C. Code data in which band data is compression-encoded is stored in the CMYK page code storage area 210D. Data not described above are stored in the area 210E.

The encoding unit 204 encodes band data stored in the main memory 210. The encoded band data is supplied to the main memory 210 via the main memory arbiter 202 and the main memory controller 203 and written in the CMYK page code storage area 210D. The decoding unit 205 reads out encoding band data encoded by the encoding unit 204 and written in the main memory 210 from the main memory 210 and decodes the encoding band data in synchronization with the printer engine 211 which will be described later. The decoded band data is supplied to the gradation processing unit 206. The gradation processing unit 206 performs a gradation process on the band data supplied from the decoding unit 205 and transmits the result of the gradation process to the engine controller 207.

The engine controller 207 controls the printer engine 211. In FIG. 1, only one of CMYK blocks is illustrated as the printer engine 211, and the other blocks are omitted for simplicity.

The communication controller 208 controls communications performed via a network 221. For example, PDL data output from the computer 220 is received by the communication controller 208 via the network. The communication controller 208 transmits the received PDL data to the main memory 210 through the main memory arbiter 202 and the main memory controller 203.

The network may be a type in which communications are performed within a predetermined range like a local area network (LAN) or a type in which communications are performed in a wider range like the Internet. The network is not limited to a wired communication network but may be of any type, for example, a wireless communication network or a serial communication according to such as universal serial bus (USB) or institute electrical and electronics engineers (IEEE) 1394.

Programs operating on the CPU 212 and various data used by the corresponding programs are compression-encoded by a compression encoding scheme according to the present embodiment and stored in the flash memory 240. For example, a program for implementing an additional function of the printer device 200 is compression-encoded and stored in the flash memory 240. The present invention is not limited thereto, and a program for implementing a basic operation of the printer device 200 may be compression-encoded and stored in the flash memory 240. The flash memory controller 241 controls access to the flash memory 240.

The encoder 242 performs compression encoding of data by a compression encoding scheme according to the present embodiment. The decoder 243 performs decoding on data compression-encoded by a corresponding compression encoding scheme.

In such a configuration, for example, when the printer device 200 is powered ON and starts its operation, the flash memory controller 241 reads out compression-encoded data from the flash memory 240 according to an instruction of the CPU 212. The compression-encoded data is, for example, one in which a program (program data) or various data is compression-encoded. The read-out compression data is supplied to the decoder 243 through the main memory arbiter 202.

The decoder 243 decodes the compression data to expand a compression code. Program data or various data in which the compression code is expanded is supplied to the main memory 210 through the main memory arbiter 202 and the main memory controller 203 and stored in the program area 210A.

For example, when the printer device 200 is powered OFF and finishes its operation, the main memory controller 203 reads out program data or various data from the main memory 210 according to an instruction by the CPU 212. The read-out program data or various data are supplied to the encoder 242 through the main memory arbiter 202.

The encoder 242 compression-encodes the program data or various data using a compression encoding scheme according to the present embodiment. The compression-encoded compression data is supplied to the flash memory controller 241 through the main memory arbiter 202 and stored in the flash memory 240.

The flash memory 240 is slow in access rate compared to a dynamic random access memory (DRAM) used in the main memory 210. For this reason, data to be stored in the flash memory 240 is compression-encoded to reduce the data size, thereby compensating the slow access rate.

An overall operation of the printer device 200 will be schematically described. For example, PDL data generated by the computer 220 is received by the communication controller 208 via the network 221 and stored in the PDL data storage area 210B of the main memory 210. The CPU 212 reads out the PDL data from the PDL data storage area 210B, interprets the PDL data, and draws a CMYK band image based on the interpretation result. CMYK band data of the drawn CMYK band image is stored in the CMYK band data storage area 210C of the main memory 210.

The encoding unit 204 reads out the CMYK band data from the CMYK band data storage area 210C and encodes the CMYK band data, for example, using a predictive coding scheme. A code data in which the CMYK band data is encoded is stored in the CMYK page code storage area 210D of the main memory 210.

The decoding unit 205 reads out the code data, which is the CMYK band data that has been encoded from the CMYK page code storage area 210D, decodes the code data, and supplies the decoded CMYK band data to the gradation processing unit 206. The gradation processing unit 206 performs a gradation process on the CMYK band data supplied from the encoding unit 205. The gradation-processed CMYK band data is supplied to the printer engine 211 through the engine controller 207. The printer engine 211 performs a print-out based on the CMYK band data.

<Encoder>

FIG. 2 illustrates an example of a configuration of the encoder 242. In the encoder 242, a data reading unit 300 reads outs program data or various data (hereinafter, referred to collectively as "data") from the program area 210A of the main memory 210 through the main memory controller 203 and the main memory arbiter 202. The data read by the data reading unit 300 is supplied to a slide/list generation processing unit 301.

The slide/list generation processing unit 301 includes a slide storage unit of a FIFO type that sequentially stores input data. The slide/list generation processing unit 301 sequentially compares received data with past input data stored in the slide storage unit. When the received data is matched with the past input data, the slide/list generation processing unit 301 holds an address value "Address" representing a position of the corresponding past input data in the slide storage unit and counts up a length "Length" as a value representing a matching length. However, when the received data does not match the past input data, the slide/list generation processing unit 301 encodes a data value into a PASS code. The slide/list generation processing unit 301 outputs the PASS code, the address value "Address", the length "Length", and a matching flag FLAG representing whether or not the received data matches the past input data.

The values output from the slide/list generation processing unit 301 are supplied to a code format generation processing unit 302. The code format generation processing unit 302 encodes the PASS code, the address value "Address," the length "Length," and the matching flag FLAG in a format illustrated in FIG. 3.

In FIG. 3, the PASS code has a header composed of a matching flag FLAG having a data length of one bit and a value of "0." A data value having a data length of eight bits is connected after the header. A slide code has a header composed of a matching flag FLAG having a data length of one bit and a value of "1." A length "Length" and an address "Address" that have a data length of eight bits, respectively, are sequentially connected after the header. The code format illustrated in FIG. 3 is an example, and the present invention is not limited thereto.

The PASS code and the slide code generated by the code format generation processing unit 302 are supplied to a code writing unit 303. The code writing unit 303 writes the PASS code and the slide code in the flash memory 240 through the main memory arbiter 202 and the flash memory controller 241.

<Overview of an Encoding Process>

Next, an encoding process in the slide/list generation processing unit 301 according to the present embodiment will be described. In the present embodiment, data encoding is performed by repeating a slide search process and a list search process. In the slide search process, past input data, stored in the slide storage unit, having a length of a predetermined unit matched with input data of one unit (for example, one byte) is searched. If data matching input data is not found in the past input data in the slide storage unit, the input data, as is, is used as the PASS code.

In the slide search process, if past input data in the slide storage unit matching the input data is found, the list search process is performed using the matched past input data as a root. In the list search process, a past input data string (called a list) in the slide storage unit matching an input data string continuously input after the root input data is searched.

In the list search process, when a list matching input data is no longer present, one of the previous lists just before that is selected and a position in the slide storage unit of the past input data that is the root of the selected list is output as the address value "Address," and a length of that list is output as the length "Length."

That is, the slide/list generation processing unit 301 generates past input data that becomes a root of the list search process in the slide search process. Further, the slide/list generation processing unit 301 performs growth and selection of lists based on the root and then performs encoding based on a finally remaining list.

A further detailed description will be given with reference to FIG. 4. In an example of FIG. 4, the slide storage unit includes 16 registers which are connected in series as designated by #0 to #15 and has a FIFO configuration. Each register is configured to store data of one unit (for example, one byte). Hereinafter, a register included in the slide storage unit is referred to as "slide."

Figure 4:
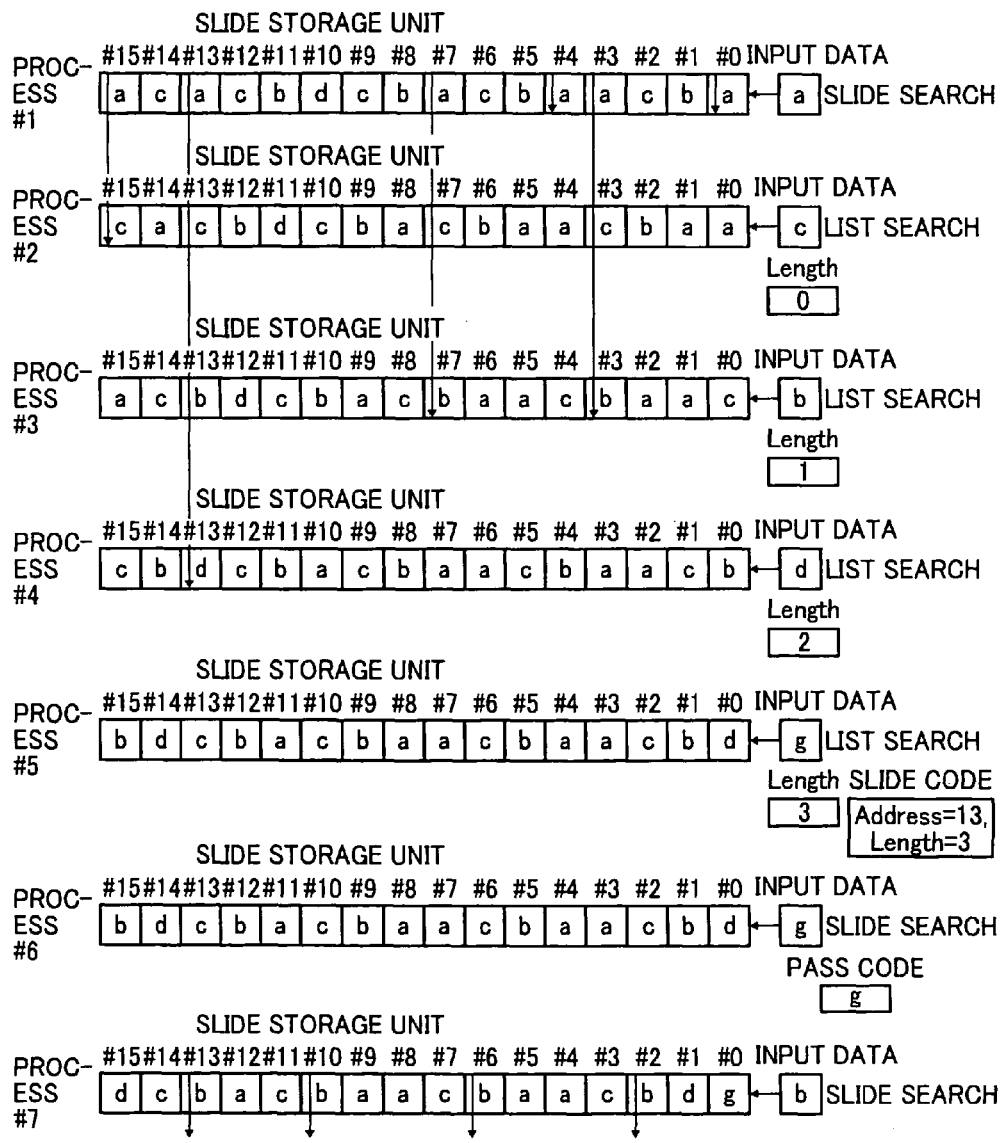
FIG. 4 illustrates an encoding process according to the present embodiment.

In a process #1, 16 past input data "a, b, c, a, a, b, c, a, b, c, d, b, c, a, c, a" have been already input in the slides of the slide storage unit, respectively, in an order in which an input is new, that is, from the right-hand side to the left-hand side in FIG. 4. First, input data "a" is input to the slide/list generation processing unit 301. In the slide search process, the input data "a" is compared with each of the past input data stored in the slides to search for matching data. In the example of FIG. 4, data stored in the slides #0, #3, #4, #7, #13, and #15 match the input data. Therefore, data stored in the slides having these numbers become roots in the list search process.

Since data matching the input data "a" is found from the past input data stored in the slides by the slide search process, a list search process of a process #2 is performed.

In the process #2, the past input data stored in each of the slides are slid to the left by one, and the input data "a" input in the process #1 is added to the slide #0 of the slide storage unit. Further, next input data "c" is input to the slide/list generation processing unit 301. In the list search process, of the past input data stored in each of the slides, data matching the new input data "c" is searched from each of the slides in which the past input data that matched the input data were stored in the previous process #1 just before the process #2.

In the example of FIG. 4, the past input data stored in the slides #0 and #4 that matched the input data in the process #1 do not match the input data in the process #2. The past input data stored in the slides #3, #7, #13, and #15 that matched the input data in the process #1 is data "c" and thus matches the new input data "c."

Since data matching the input data "c" in the process #2 are found by the list search process of the process #2 from each of the slides which store the past input data that matched the input data in the previous process #1 just before the process #2, the next process is a list search process. Since the process #2 is a starting point of the list search process, the length "Length" representing a list length has a value of "0."

In the process #3, similarly to the above-describe process #2, the past input data stored in each of the slides is slid by one, and the input data "c" input in the process #2 is added to the slide #0 of the slide storage unit. Further, next input data "b" is input to the slide/list generation processing unit 301. Of the past input data stored in each of the slides, data matching the new input data "b" is searched from each of the slides in which the past input data that matched the new input data were stored in the previous process #2 immediately before the process #3.

In the example of FIG. 4, the past input data stored in the slide #15 searched in the process #2 does not match the input data in the process #3. The past input data in the process #3 stored in the slides #3, #7, and #13 searched in the process #2 are data "b" and thus match the new input data "b." In a next process #4, the past input data stored in the slides #3, #7, and #13 become a list search target. That is, in the process #3, lists relative to the slides #3, #7, and #13 remain. In the process #3, a list length is "1," and thus the length "Length" has a value of "1."

The above-described processes are repeated to obtain a data string with a longest list. In the example of FIG. 4, in a process #5, past input data "c" stored in the slide #13 list-searched in the previous process #4 just before the process #5 does not match new input data "g," and thus the list is broken. In the process #5, one of the lists remaining in the previous process #4 just before the process #5 is selected and encoding into a slide code is performed with a position (number) of that slide in the slide storage unit being the address value "Address", and a length of the list being the length "Length".

In the example of FIG. 4, the address value "Address" is "13," and the length "Length" is "3."

In the process #5, the slide search process is performed on input data "g." In this example, since data "g" is not stored as the past input data in any of the slide, there is no matching data. In this case, the process proceeds to a process #6, and the input data "g" is used "as is" to be encoded into a PASS code.

When encoding into the PASS code is performed, in the process #7, past input data stored in each of the slides is slid by one, and the input data "g" input in the previous list search process (the process #5) is added to the slide #0 of the slide storage unit. The slide search process is performed on next input data "b."

The slide storage unit is able to slide the data stored in each slide by the FIFO method and thus to proceed to processing of next input data while maintaining the list for which matching with input data has been stored "as is."

For example, in the example of FIG. 4, in the process #1, the input data matches the past input data stored in the slides #0, #3, #4, #7, #13, and #15. By sequentially sliding the data stored in each of the slides as new data is input, next data is stored in the slides #0, #3, #4, #7, #13, and #15 in the process #2. Therefore, in the slide storage unit, the data stored in the slide having the number which was found to match in the slide search process is compared with the input data in each list search process, whereby a data string of the past input data matching a data string of the input data is searchable.

Since the slide storage unit employs the FIFO method as described above, the list search process is able to be easily performed.

Further, according to the above-described process, if there is no list matching the input data in the list search process and the process proceeds from the list search process to the slide search process, a time period is generated during which encoding does not progress and which is worth one process. That is, when one process is to be performed in one clock, one clock is wasted when shifting from the list search process to the slide search process.

<Flag Process>

The slide search process and the list search process are controlled by a flag. A flag process in the slide search process and the list search process will be described with reference to FIGS. 5A and 5B.

FIG. 5A illustrates an R flag RFLGm representing a result of the slide search process. As illustrated in FIG. 5A, when input data "a" is input in a state in which past input data "a, b, c, a, a, b, c, a, b, c, d, b, c, a, c, a" are stored in the slides of the slide storage unit from right to left in the drawing, the past input data stored in the slides #0, #3, #4, #13, and #15 match the input data. Therefore, R flags RFLG0, RFLG3, RFLG4, RFLG7, RFLG13, and RFLG15, which correspond to the slides having these numbers, are set to a value of "1" representing a match, respectively.

When input data matches the past input data stored in the slides, the list search process is performed instead of an encoding process. At this time, a position of the R flag RFLGm relative to each slide is fixed. When the past input data stored in the slides do not match the input data, the input data is used "as is" to be encoded into a PASS code, and the slide search process is performed on next input data.

FIG. 5B illustrates an example of a W flag WFLGm representing a result of the list search process. In the list search process, data matching input data newly input is searched from the data stored in the slides for which the R flag RFLGm has been set to "1" of the slides. If matching data is found, a value of the W flag WFLGm for the corresponding slide is set to a value of "1" representing a match.

In the example of FIG. 5B, the list search process is performed on the data stored in the slides #0, #3, #4, #7, #13, and #15 for which each value of the R flag RFLGm has been set to "1" of the past input data stored in the slides. Since the data stored in the slides #3, #7, #13, and #15 match input data "c," values of corresponding W flags WFLG3, WFLG7, WFLG13 and WFLG15 are set to a value "1" representing a match. Of the past input data stored in each of the slides, the data stored in the slides for which the value of the W flag WFLGm has been set to "1" indicate that the past input data stored in the slides matching the previously input data input immediately before is strung with the past input data matching the presently input data.

Next, the W flag WFLGm having a value of "1" is searched. When the W flag WFLGm having a value of "1" is present, the list search process is performed on next input data in the same manner as described above using each W flag WFLGm as a new R flag RFLGm.

If the W flag WFLGm having a value of "1" is not present as a result of the search, it means that the list has come to an end. In this case, one R flag RFLGm having a value of "1" is selected. An address value "Address" of the slide corresponding to the selected R flag RFLGm and the length "Length" at that time are encoded into the slide code.

Next, the slide search process and the list search process when the R flag RFLGm and the W flag WFLGm are used will be described with reference to FIGS. 6A to 6H. In FIGS. 6A to 6H, similarly to FIG. 4, the slide storage unit has 16 slides designated by #0 to #15. Further, let us assume that 16 past input data "a, b, c, a, a, b, c, a, b, c, d, b, c, a, c, a" are previously stored in the slides, in an order of newness, that is, in an ascending order of slide numbers.

Figure 6A:
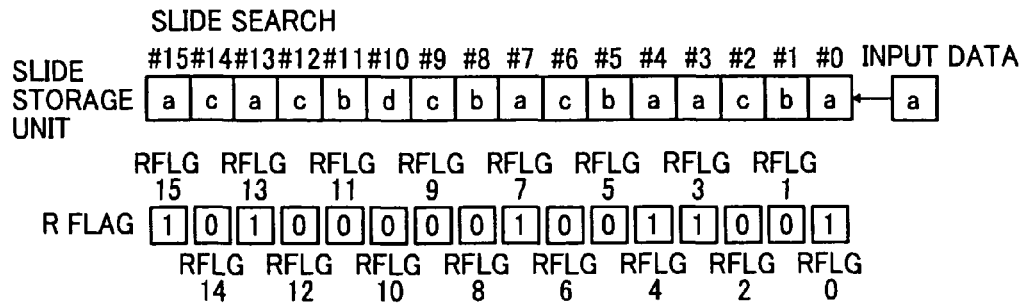
FIG. 6A illustrates a slide search process and a list search process when a flag process is performed.

In the present embodiment, encoding is performed by repetitively performing the slide search process and the list search process. First, input data "a" is input, and the slide search process is performed (FIG. 6A). Data matching the input data "a" is searched from the slides of the slide storage unit. When data matching the input data is not found from the slides, corresponding input data is used "as is" to be encoded into a PASS code.

When a slide storing data matching the input data is found, the value of the R flag RFLGm corresponding to the slide is set to "1," and values of the other R flags RFLGm are set to "0." In the example of FIG. 6A, the data stored in the slides #0, #3, #4, #7, #13, and #15 match the input data. In the slide search process, the data matching the input data is used as the root for list generation in the next list search process.

Next, the storage contents of each of the slides are slid to the left, and the previous input data "a" immediately before is added to the slide #0. When a slide storing the data matching the input data is found in the slide search process as described above, the process proceeds to the list search process (FIG. 6B) instead of the encoding process, and the value of the length "length" is set to "0." The values of the R flags RFLGm (R flags RFLG0, RFLG3, RFLG4, RFLG7, RFLG13, and RFLG15) corresponding to the slides (the slides #0, #3, #4, #7, #13, and #15) storing the data matching the input data are set to "1," and the values of the other flags RFLGm are set to "0."

Figure 6B:
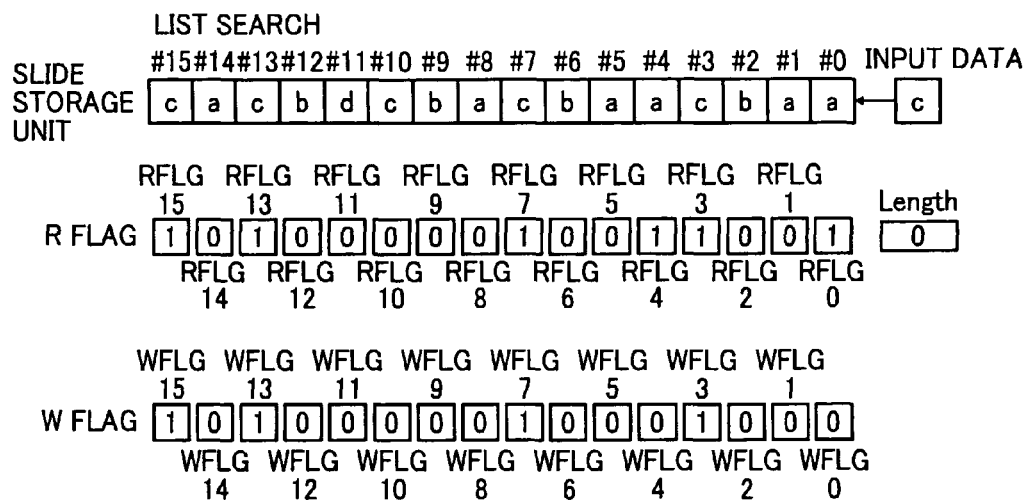
FIG. 6B illustrates a slide search process and a list search process when a flag process is performed.

Next, input data "c" is input. In the list search process, of the slides each for which the value of the corresponding R flag RFLGm is "1," a slide storing the data matching the input data "c" is searched. In the example of FIG. 6B, of the slides each for which the value of the R flag RFLGm is "1," the data stored in the slides #3, #7, #13, and #15 match the input data. The slides #0 and #4 are excluded. The values of the W flag WFLGm (the W flags WFLG3, WFLG7, WFLG13, and WFLG15) corresponding to these slides storing the data matching the input data are set to "1," and the values of the other W flags WFLGm are set to "0."

Next, the storage contents of each of the slides are slid to the left, and the previous input data "c" immediately before is added to the slide #0. The process proceeds to the next list search process (FIG. 6C) instead of the encoding process, and the value of the length "length" is set to "1." The values of the W flags WFLGm are set to the R flags RFLGm to update the R flags RFLGm.

Figure 6C:
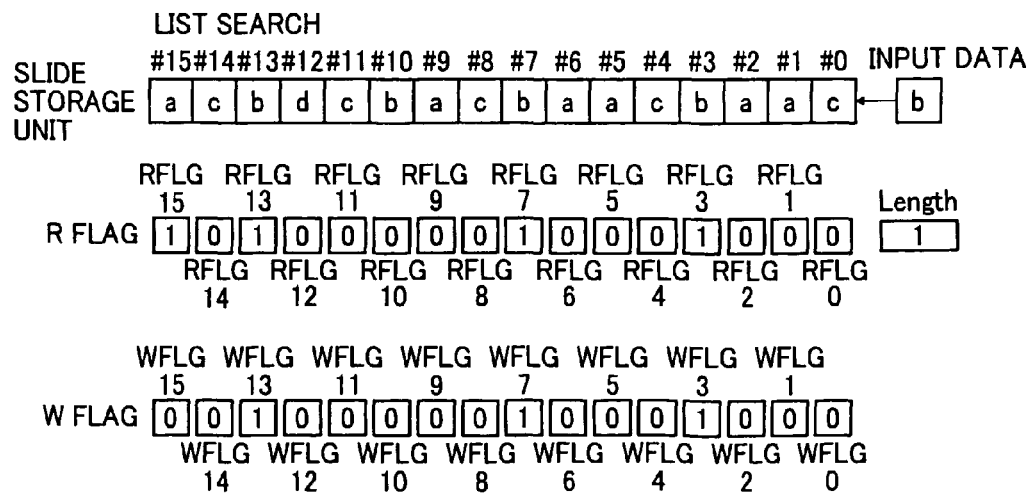
FIG. 6C illustrates a slide search process and a list search process when a flag process is performed.

Next, input data "b" is input. In the list search process, of the slides each for which the value of the corresponding R flag RFLGm is "1," a slide storing the data matching the input data "b" is searched. In the example of FIG. 6C, of the slides each for which the value of the R flag RFLGm is "1," the data stored in the slides #3, #7, and #13 match the input data. The slide #15 is excluded. The values of the W flag WFLGm (the W flags WFLG3, WFLG7, and WFLG13) corresponding to the slides storing the data matching the input data are set to "1," and the values of the other W flags WFLGm are set to "0."

Next, the storage contents of each of the slides are slid to the left, and the previous input data "b" immediately before is added to the slide #0. The process proceeds to the next list search process (FIG. 6D) instead of performing the encoding process, and the value of the length "length" is set to "2." The values of the W flags WFLGm are set to the R flags RFLGm to update the R flags RFLGm.

Next, input data "d" is input. In the list search process, of the slides each for which the value of the corresponding R flag RFLGm is "1," a slide storing the data matching the input data "d" is searched. In the example of FIG. 6D, the data stored in the slide #13 matches the input data. Meanwhile, the slides #3 and #7 are excluded. The value of the W flag WFLG13 corresponding to the slide storing the data matching the input data is set to "1."

Next, the storage contents of each of the slides are slid to the left, and the previous input data "d" input immediately before is added to the slide #0. The process proceeds to the next list search process (FIG. 6E) without performing the encoding process, and the value of the length "length" is set to "3." The values of the W flags WFLGm are set to the R flags RFLGm to update the R flags RFLGm.

Next, input data "a" is input. In the list search process, of the slides each for which the value of the corresponding R flag RFLGm is "1," a slide storing the data matching the input data "a" is searched. In the example of FIG. 6E, the slide #13 is excluded, and thus the slide storing the data matching the input data "a" is not present. That is, a continuing list is not present. Accordingly, a position of the slide for which the value of the R flag RFLGm is "1" in the slide storage unit (a position of the slide #13 in the example of FIG. 6E) is the address value "Address," the value of the length "Length" is "3," and the value of the matching flag FLAG is "1." These values are encoded into a slide code as illustrated in FIG. 3. All of the values of the W flags WFLG are now set to "0," and the process proceeds to the slide search process (FIG. 6F).

A slide search after the breakage of the list is performed on the input data "a" in the previous list search process performed immediately before (FIG. 6F). Data matching the input data "a" is searched from the slides of the slide storage unit. If data matching the input data is not found from any of the slides, the corresponding input data is used "as is" to be encoded into a PASS code.

When the slide storing data matching the input data is found, the value of the R flag RFLGm corresponding to the slide is set to "1." In the example of FIG. 6F, the data stored in the slides #3, #4, #7, #8, and #11 match the input data. In the slide search process, the data that matched the input data are used as the roots for list generation in the next list search process.

Next, the storage contents of each of the slides are slid to the left, and input data "a" is added to the slide #0. When the slide storing data matching the input data is found in the slide search process as described above, the process proceeds to the list search process (FIG. 6G) without performing the encoding process, and the value of the length "length" is set to "0." The values of the R flags RFLGm (R flags RFLG3, RFLG4, RFLG7, RFLG8, and RFLG11) corresponding to the slides (the slides having the numbers #3, #4, #7, #8, and #11) storing the data matching the input data are set to "1," and the values of the other flags RFLGm are set to "0."

Next, input data "f" is input. In the list search process, of the slides each for which the value of the corresponding R flag RFLGm is "1," a slide storing data matching the input data "f" is searched. In the example of FIG. 6G, the slide storing the data matching the input data "f" is not present. At this point in time, since the value of the length "Length" is "0," all of the values of the W flags WFLGm are set to "0," and the process proceeds to the slide search process (FIG. 6H).

The slide search process is performed on the input data "f" input in the previous list search process immediately before (FIG. 6H). Data matching the input data "f" is searched from the slides of the slide storage unit. In the example of FIG. 6H, since the data matching the input data is not found from any of the slides, the corresponding input data is used "as is" to be encoded into a PASS code. Further, all of the values of the R flags RFLGm are set to "0."

The storage contents of each of the slides are slid to the left, and input data "f" is added to the slide #0, and the process proceeds to the next list search process.

<Details of an Encoding Process>

Figure 7:
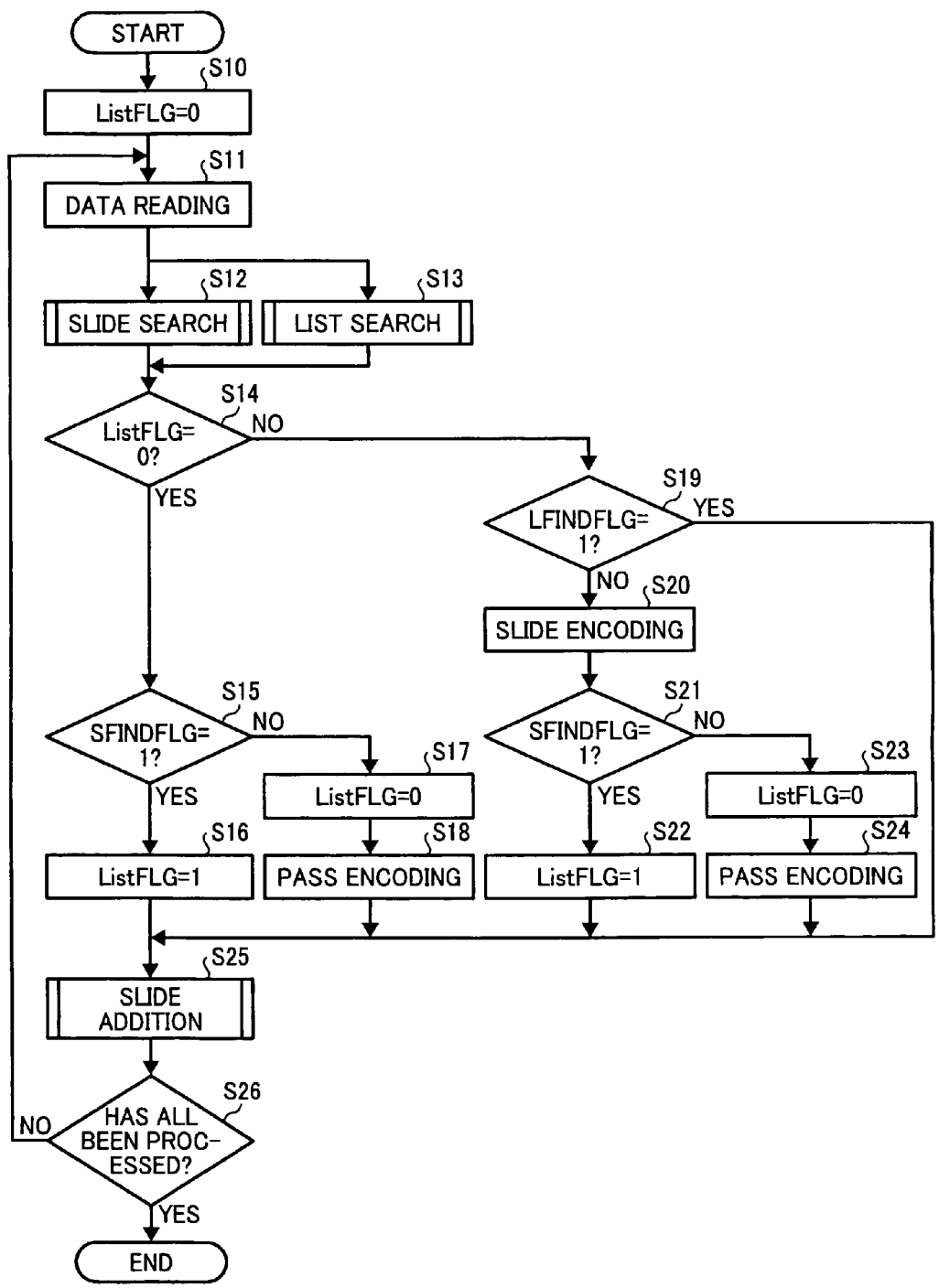
FIG. 7 is an example of a flowchart illustrating an overall flow of an encoding process according to the present embodiment.

Next, an encoding process in the slide/list generation processing unit 301 will be described in further detail. FIG. 7 is a flowchart illustrating an example of an overall flow of an encoding process according to the present embodiment. Before the process of the flowchart of FIG. 7, the code reading unit 300 already holds data of a certain length as process target data.

In step S10, the slide/list generation processing unit 301 initializes a flag ListFLG, which indicates which of the slide search process and the list search process is effective, to a value "0", which indicates that the slide search process is being performed. Next, in step S11, the slide/list generation processing unit 301 reads data of one unit from the code reading unit 300 as input data. The read input data is stored in the slide storage unit.

When the input data is stored in the slide storage unit, in step S12, the slide search process is performed on the data of one unit, and in step S13, the list search process is performed on the data of one unit. As will be described later in further detail, in the present embodiment, a slide search unit that performs the slide search process and a list search unit that performs the list search process are separately configured, and thus the processes of step S12 and step S13 are able to be performed in parallel.

The process proceeds to step S14, and the slide/list generation processing unit 301 determines whether or not the value of the flag ListFLG is "0." When it is determined to be "0," the slide search process is presently effective, and the process proceeds to step S15. In step S15, it is determined whether or not a value of a flag SFINDFLG is "1." When it is "1," it is determined that past input data matching the input data was found in a slide storage unit 101, and thus in step S16, the value of the flag ListFLG is set to "1" representing that the list search process is effective.

Then, the process proceeds to step S25, and the input data is added to the slide storage unit. In step S26, it is determined whether or not processing on all of process target data has been completed. When it is determined as not completed, the process returns to step S11, and next data of one unit is read in as input data. However, when it is determined as completed, the series of encoding processes are ended.

Meanwhile, when it is determined in step S15 that the value of the flag SFINDFLG is "0," it is determined that past input data matching the input data was not found in the slide storage unit 101, and the process proceeds to step S17. In step S17, the value of the flag ListFLG is set to "0," to set the slide search process as effective. In step S18, the input data is encoded into the PASS code. Further, the value of the matching flag FLAG is set to "0," and the process proceeds to step S25.

When it is determined in step S14 that the value of the flag ListFLG is not "0" but "1," it is determined that the list search process is presently effective, and the process proceeds to step S19. In step S19, it is determined whether or not the value of the flag LFINDFLG is "1." When it is determined to be "1," the process proceeds to step S25.

Meanwhile, when it is determined in step S19 that the value of the flag LFINDFLG is not "1," that is, the value of the flag LFINDFLG is "0," the process proceeds to step S20. In step S20, the address value "Address," the length "Length", and the matching flag FLAG are encoded into the slide code as illustrated in FIG. 3. The process proceeds to step S21, and it is determined whether or not the value of the flag SFINDFLG is "1." When it is determined to be "1," it is determined that the list has continued in the list search process, and the process proceeds to step S22. The value of the flag ListFLG is set to "1," and the process proceeds to step S25.

When it is determined in step S21 that the value of the flag SFINDFLG is "0," it is determined that the list has broken in the list search process, and the process proceeds to step S23. The value of the flag ListFLG is set to "0." In step S24, the input data is encoded into a PASS code "as is" and stored in a register 141. The process proceeds to step S25.

Figure 8:
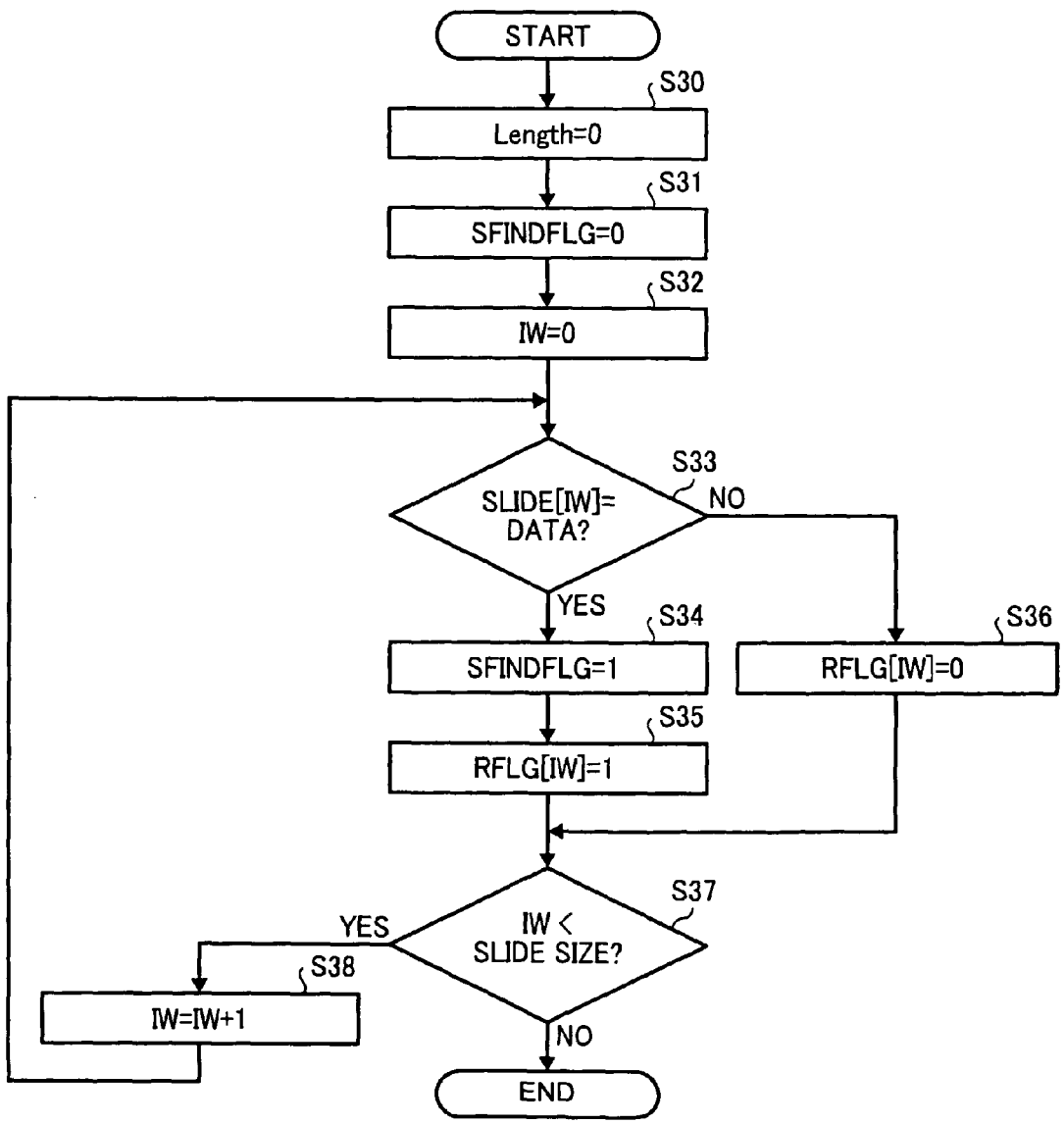
FIG. 8 is a flowchart illustrating a slide search process in further detail.
Figure 9:
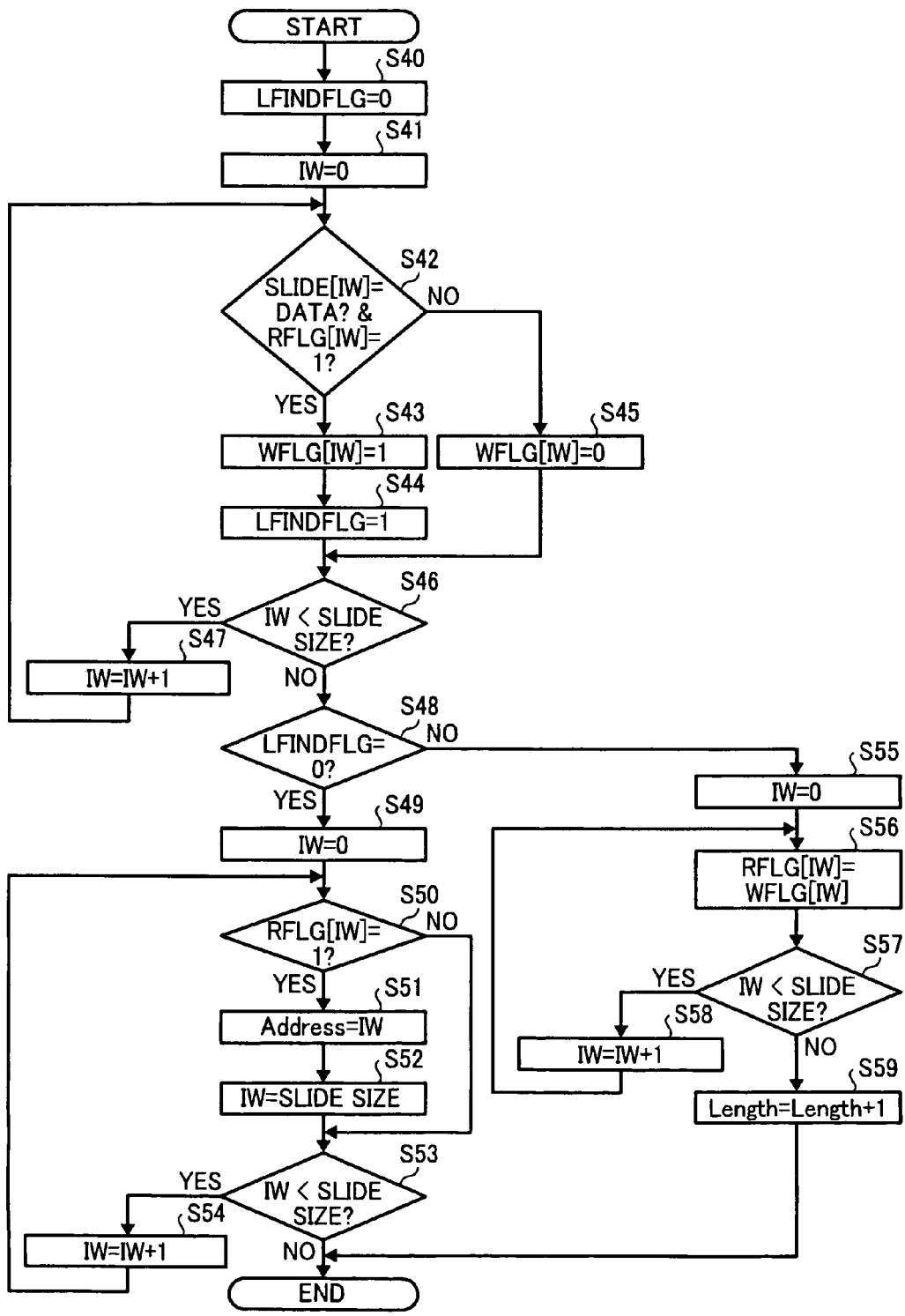
FIG. 9 is a flowchart illustrating a list search process in further detail.
Figure 10:
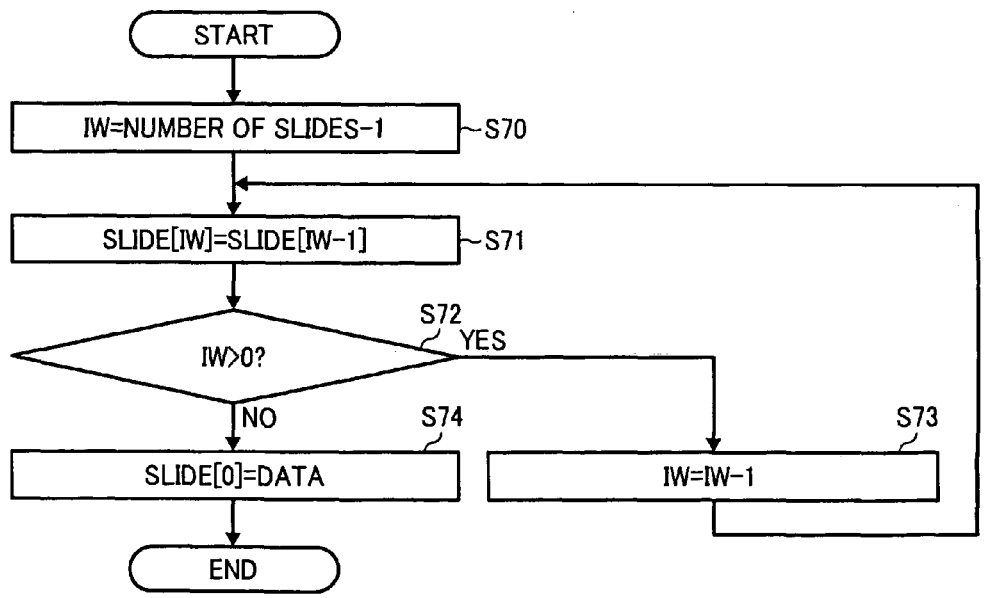
FIG. 10 is a flowchart illustrating a slide search process in further detail.
Figure 12:
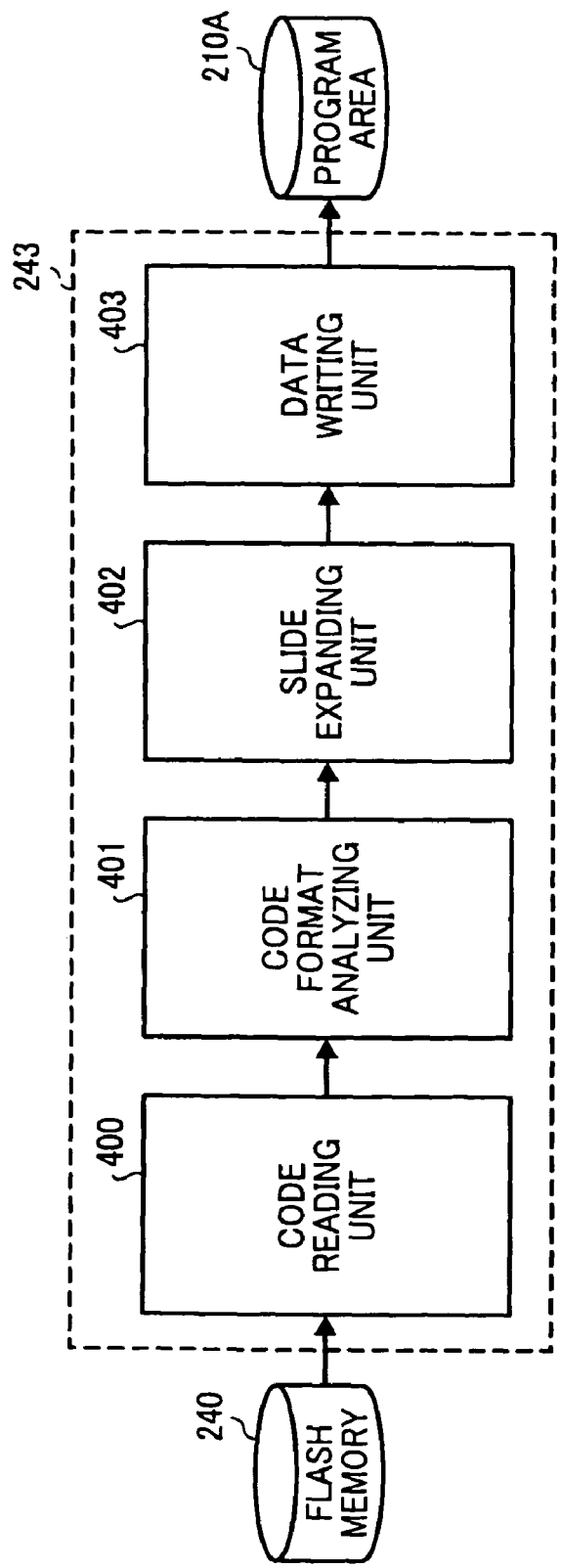
FIG. 12 is a block diagram illustrating an example of a configuration of a decoder.

FIG. 8 is a flowchart illustrating an example of the slide search process in step S12 of FIG. 12 in further detail. In FIGS. 8, 9, and 10, the slides in the slide storage unit are each represented as slide [x] to include the slide number. Further, a head slide in the slide storage unit having a FIFO configuration is designated as slide [0].

First, in step S30 to step S32, the length "Length", the flag SFINDFLG, and a variable IW are each initialized to a value of "0". The process proceeds to step S33, and it is determined whether or not input data matches the past input data stored in a slide [IW]. When it is determined to match, the process proceeds to step S34, and the value of the flag SFINDFLG is set to "1," and in step S35, the value of the R flag RFLG[IW] is set to "1."

Then, the process proceeds to step S37, and it is determined whether or not the variable IW is less than the slide size, that is, the number of slides included in the slide storage unit. When it is determined that the variable IW is less than the slide size, in step S38, "1" is added to the variable IW, and the process returns to step S33. When it is determined that the variable IW is equal to or greater than the slide size, a series of processes are ended.

Meanwhile, when it is determined in step S33 that the input data does not match the past input data stored in the slide [IW], the process proceeds to step S36, and the value of the R flag RFLG[IW] is set to "0." Then, the process proceeds to step S37.

FIG. 9 is a flowchart illustrating an example of the list search process in step S13 of FIG. 7 in further detail. First, in step S40 and step S41, the flag LFINDFLG and the variable IW are each initialized to a value "0".

In step S42, it is determined whether or not input data is matches the past input data stored in the slide [IW] and the value of the R flag RFLG[IW] is "1." When it is determined that these two conditions are satisfied, the process proceeds to step S43, and the value of the W flag WFLG[IW] is set to "1." In step S44, the value of the flag LFINDFLG is set to "1." Then, the process proceeds to step S46.

Meanwhile, in step S42, when it is determined that the above-described condition is not satisfied, that is, the input data is not matched with the past input data stored in the slide [IW] and/or the value of the R flag RFLG[IW] is not "1," the process proceeds to step S45, and the value of the W flag WFLG[IW] is set to "0". Then, the process proceeds to step S46.

In step S46, it is determined whether or not the variable IW is less than the slide size. When it is determined that the variable IW is less than the slide size, in step S47, "1" is added to the variable IW, and the process returns to step S42. Meanwhile, when it is determined that the variable IW is equal to or more than the slide size, the process proceeds to step S48.

In step S48, it is determined whether or not the value of the flag LFINDFLG is "0." When it is determined that the value is "0," the process proceeds to step S49, and the variable IW is initialized to a value of "0." In step S50, it is determined whether or not the value of the R flag RFLG[IW] is "1." When it is determined to b "1," the process proceeds to step S51.

In step S51, the variable IW is set to the address value "Address," and in step S52, the slide size is assigned to the variable IW. Then, the process proceeds to step S53. In step S53, it is determined whether or not the variable IW is less than the slide size. When it is determined that the variable IW is less than the slide size, in step S54, "1" is added to the variable IW, and the process returns to step S50.

When it is determined in step S53 that the variable IW is equal to or greater than the slide size, a series of processes are ended. For example, when the process proceeds to step S53 via step S52, since in step S52, the slide size has been substituted into the variable IW, the process is inevitably finished.

When it is determined in step S48 that the value of the flag LFINDFLG is not "0," the process proceeds to step S55, and the variable IW is initialized to a value of "0." In step S56, the W flag WFLG[IW] is set with respect to the R flag RFLG[IW]. In step S57, it is determined whether or not the variable IW is less than the slide size. When it is determined that the variable IW is less than the slide size, in step S58, "1" is added to the variable IW, and the process returns to step S56. Meanwhile, when it is determined in step S57 that the variable IW is equal to or greater than the slide size, the process proceeds to step S59, and "1" is added to the length "Length." Then, a series of processes are ended.

FIG. 10 is a flowchart illustrating an example of a slide adding process in step S25 of FIG. 7 in further detail. First, in step S70, a value obtained by subtracting "1" from the number of slides is set to the variable IW. In step S71, the value of the slide [IW-1] is stored in the slide [IW]. In step S72, it is determined whether or not the variable IW exceeds "0." When it is determined that the variable IW exceeds "0," the process proceeds to step S73, and "1" is subtracted from the variable IW. Then, the process returns to step S71. Meanwhile, when it is determined in step S72 that the variable IW is less than "0," the process proceeds to step S74, and input data is stored in the slide [0].

<A Hardware Configuration Example of the Slide/List Generation Processing Unit>

Figure 11:
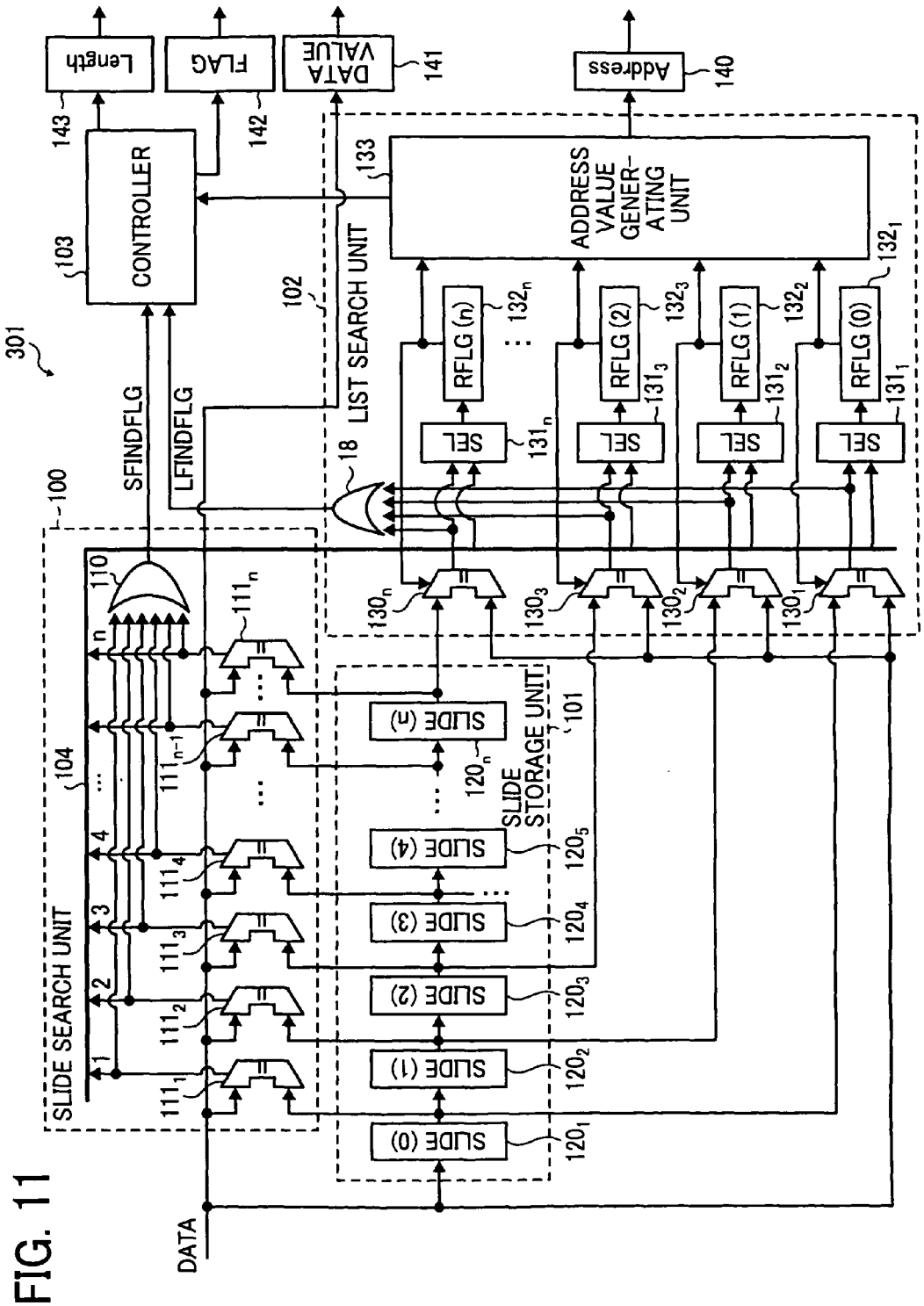
FIG. 11 is a circuit diagram illustrating an example of a hardware configuration of a slide/list generation processing unit.

FIG. 11 illustrates an example of a hardware configuration of the slide/list generation processing unit 301 that performs the slide search process, the list search process, and the encoding process which are described above. The slide/list generation processing unit 301 includes a slide search unit 100, the slide storage unit 101, a list search unit 102, and a controller 103.

The controller 103 includes, for example, a microprocessor and performs the processes of step S11 to step S26, excluding step S12 and step S13, described with reference to the flowchart of FIG. 7 to control an operation of the slide/list generation processing unit 301. For example, the controller 103 performs operation control based on the flag ListFLG representing which of the present slide search process and the list search process is effective.

For example, input data of one unit is input per clock to the slide/list generation processing unit 301 and supplied to each of the slide search unit 100, the slide storage unit 101, and the list search unit 102. The input data is also stored in the register 141 at an output side. The input data stored in the register 141 is used as a data value for the encoding of the PASS code. Hereinafter, one byte is used as one unit of data.

The slide storage unit 101 includes n (for example, 256) slides $120_1$, $120_2$, ..., and $120_n$, which are connected in series. Each slide includes a register and stores data of one unit. An output of each of the slides $120_1$, $120_2$, ..., and $120_n$ is supplied to a next register and also supplied to one of input terminals of a comparator $111m$ of the slide search unit 100 which will be described later and one of input terminals of a comparator $130_m$ of the list search unit 102, respectively.

In the slide code described in FIG. 3, the data lengths of the address value "Address" and the length "Length" depend on the number (n) of slides included in the slide storage unit 101. That is, when the number (n) of slides is 256, the data lengths of the address value "Address" and the length "Length" are determined as having 8 bits, respectively, in order to be able to express a value of up to "256."

In the slide storage unit 101, a FIFO configuration is formed with the n slides $120_1$, $120_2$, ..., and $120_n$, and input data is sequentially transmitted from the slide $120_1$ to the slide $120_2$, then to the slide $120_3$, ..., and the to the $120_n$ per one clock.

The slide search unit 100 includes n comparators $111_1$, $111_2$, ..., and $111_n$ and a logical sum circuit 110 having n inputs. Each of the n comparators $111_1$, $111_2$, ..., and $111_n$ compares data input to one of the input terminal with data input to the other one of the input terminals and outputs "1" when the two match and "0" when the two do not match.

The outputs of the slides $120_1$, $120_2$, ..., and $120_n$ included in the slide storage unit 101 are input to one of the input terminals of the comparators $111_1$, $111_2$, ..., and $111_n$, respectively. Further, input data is input to the other one of the input terminals of the comparators $111_1$, $111_2$, ..., and $111_n$.

The outputs of the comparators $111_1$, $111_2$, ..., and $111_n$ are input to the logical sum circuit 110 having the n inputs, respectively, and also input to selectors (SEL) $131_1$, $131_2$, ..., $131_n$ of the list search unit 102 which will be described later, respectively. An output of the logical sum circuit 110 is supplied to the controller 103 as the flag SFINDFLG. The flag SFINDFLG represents whether or not at least one of data in the slides $120_1$, $120_2$, ..., and $120_n$ matches the input data.

The list search unit 102 includes n comparators $130_1$, $130_2$, ..., $130_n$, n selectors $131_1$, $131_2$, ..., $131_n$, n registers $132_1$, $132_2$, ..., $132_n$, an address value generating unit 133, and a logical sum circuit 18 having n inputs. Each of the n comparators $130_1$, $130_2$, ..., and $130_n$ compares data input to one input terminal with data input to the other input terminal and outputs "1" when the two match and "0" when the two do not match.

The outputs of the slides $120_1$, $120_2$, ..., and $120_n$ included in the slide storage unit 101 are input to the one input terminals of the comparators $130_1$, $130_2$, ..., and $130_n$, respectively. Further, input data is input to the other input terminals of the comparators $130_1$, $130_2$, ..., and $130_n$.

The outputs of the comparators $130_1$, $130_2$, ..., and $130_n$ are input to the logical sum circuit 18 having the n inputs as the W flag WFLGm and also input to the other input terminals of the selectors $131_1$, $131_2$, ..., $131_n$, respectively. An output of the logical sum circuit 18 is supplied to the controller 103 as the flag LFINDFLG. The flag LFINDFLG represents that at least one of the flags WFLG1, WFLG2, ..., WFLGn has a value of "1."

The outputs of the selectors $131_1$, $131_2$, ..., and $131_n$ are stored in the registers $132_1$, $132_2$, ..., and $132_n$, respectively, as the R flag RFLGm. The selectors $131_1$, $131_2$, ..., and $131_n$ are controlled by the flag ListFLG supplied through a path (not illustrated) from the controller 103 to select one of the two terminals thereof.

When the value of the flag ListFLG is "0" and so represents that the slide search process is presently effective, the selectors $131_1$, $131_2$, ..., and $131_n$ are controlled to supply the outputs of the comparators $111_1$, $111_2$, ..., and $111_n$ in the slide search unit 100, which are input to the one input terminals thereof, to the registers $132_1$, $132_2$, ..., and $132_n$. For example, the selector $131_m$ ($1 \leq m \leq n$) is controlled to select the one input terminal when the value stored in the corresponding register $132_m$ is "0."

Meanwhile, when the value of the flag ListFLG is "1" and so represents that the list search process is presently effective, the selectors $131_1$, $131_2$, ..., and $131_n$ are controlled to select and supply the outputs of the comparators $130_1$, $130_2$, ..., and $130_n$ in the list search unit 102, which are respectively input to the other input terminals thereof, to the registers $132_1$, $132_2$, ..., and $132_n$. For example, the selector $131_m$ ($1 \leq m \leq n$) is controlled to select the other input terminal when the value stored in the corresponding register $132_m$ is "1."

When the outputs of the selectors $131_1$, $131_2$, ..., and $131_n$ are received, the registers $132_1$, $132_2$, ..., $132_n$ output the R flags RFLG1, RFLG2, ..., and RFLGn stored therein. That is, the R flags RFLG1, RFLG2, ..., and RFLGn stored in the registers $132_1$, $132_2$, ..., and $132_n$ are updated by the outputs of the selectors $131_1$, $131_2$, ..., and $131_n$, respectively.

The R flags RFLG1, RFLG2, ..., and RFLGn output from the registers $132_1$, $132_2$, ..., and $132_n$ are supplied to control terminals of the comparators $130_1$, $130_2$, ..., and $130_n$ as control signals that control operations of the comparators $130_1$, $130_2$, ..., and $130_n$. For example, the comparator $130_m$ performs a comparison operation when the control signal supplied from the corresponding register $132_m$ represents "1" and does not perform a comparison operation when the control signal represents "0." This means that operations of the comparators $130_1$, $130_2$, ..., and $130_n$ are narrowed down by outputs of the comparators $130_1$, $130_2$, ..., and $130_n$ themselves.

The R flags RFLG1, RFLG2, ..., and RFLGn output from the registers $132_1$, $132_2$, ..., and $132_n$ are also supplied to the address value generating unit 133. The address value generating unit 133 selects the R flag RFLGm having a value of "1"

from the R flags RFLG1, RFLG2, . . . , and RFLGn supplied from the registers $132_1$, $132_2$, . . . , and $132_n$ and outputs the number of the selected R flag RFLGm as the address value "Address" when the list search process is finished as described above in the process #5 of FIG. 4. The address value "Address" output from the address value generating unit 133 is stored in a register 140 and also supplied to the controller 103.

Here, the address value generating unit 133 preferentially selects the R flag RFLGm having a small slide number, that is, the R flag RFLGm based on the slide 120m closer to the input side in the slide storage unit 101 when a plurality of R flags RFLGm each having a value of "1" are present. It is because the slide closer to the input has a higher possibility of matching the input data. At this time, the code format described in FIG. 3 is preferably configured so that one having a small address value "Address" has a short code to increase the efficiency of compression.

The controller 103 generates the length "Length" and the matching flag FLG representing whether or not there is a match, based on the flag SFINDFLG supplied from the slide search unit 100, the flag LFINDFLG supplied from the list search unit 102, and the address value "Address" supplied from the address value generating unit 133. The length "Length" and the matching flag FLAG are stored in the registers 143 and 142, respectively.

The address value "Address", the data value, the matching flag FLAG, and the length "Length" respectively stored in the registers 140 to 143 are read out to the code format generation processing unit 302 and encoded in a code format as illustrated in FIG. 3 to generate code data.

In such a configuration, the slide search process is performed as follows. That is, the comparators $111_1$, $111_2$, . . . , and $111_n$ compare input data with past input data stored in the slides $120_1$, $120_2$, . . . , and $120_n$. The comparison results are supplied to the logical sum circuit 110, so that the flag. SFINDFLG is output. The comparison results are also supplied to the selectors $131_1$, $131_2$, . . . , and $131_n$ and stored in the registers $132_1$, $132_2$, . . . , and $132_n$ during the slide search process. According to the configuration of FIG. 11, this series of processes are executable in one clock.

Further, the list search process is performed as follows. That is, the comparators $130_1$, $130_2$, . . . , and $130_n$ compare input data with past input data stored in the slides $120_1$, $120_2$, . . . , and $120_n$. At this time, the comparison operations of the comparators $130_1$, $130_2$, . . . , and $130_n$ are controlled based on the values of the R flags RFLG1, RFLG2, . . . , and RFLGn stored in the registers $132_1$, $132_2$, . . . , and $132_n$. For example, when all of the values of the R flags RFLG1, RFLG2, . . . , and RFLGn are "0," all of comparators $130_1$, $130_2$, . . . , and $130_n$ do not perform the comparison operation. This state is a state in which the list search process is not being performed.

The comparison results by the comparators $130_1$, $130_2$, . . . , and $130_n$ are supplied to the logical sum circuit 18, so that the flag LFINDFLG is output. The comparison results are supplied to the selectors $131_1$, $131_2$, . . . , and $131_n$, respectively, and stored in the registers $132_1$, $132_2$, . . . , and $132_n$ during the list search process. The R flags RFLG1, RFLG2, . . . , and RFLGn stored in the registers $132_1$, $132_2$, . . . , and $132_n$ are also held in the address value generating unit 133.

The address value generating unit 133 transmits a position of the R flag RFLGm having a value of "1" among the R flags RFLG1, RFLG2, . . . , and RFLGn held therein to the controller 103 as the address value "Address" when all of the values held in the registers $132_1$, $132_2$, . . . , and $132_n$ are "0."

According to the configuration of FIG. 11, this series of processes by the list search process are executable in one clock.

According to the configuration of FIG. 11, the slide search unit 100 and the list search unit 102 are separately configured, and the slide search unit 100 and the list search unit 102 share the slide storage unit 100. Therefore, it is possible to perform the slide search process by the slide search unit 100 and the list search process by the list search unit 102 in parallel. As described in FIG. 4, the waste of one clock upon switchover from the list search process to the slide search process is not generated, and thus the encoding process is able to be speeded up. Further, according to the configuration of FIG. 11, since a lookahead buffer or a large-scale matrix array is not required, the hardware scale is reducible.

<Decoder>

FIG. 12 illustrates an example of a configuration of the decoder 243. In the decoder 243, a code reading unit 400 reads code data encoded by the encoder 242 from the flash memory 240. The code data read to the code reading unit 400 is supplied to a code format analyzing unit 401. The code format analyzing unit 401 interprets the code data according to the code format described in FIG. 3 to extract the data value, the address value "Address," the length "Length", and the matching flag FLAG. The extracted data is supplied to a slide expanding unit 402.

The slide expanding unit 402 has a slide storage unit including a plurality of registers connected in series in a FIFO configuration as described above with reference to FIG. 4. Each register is called a slide and is able to store data of one unit (for example, one byte). The slide expanding unit 402 expands data with respect to each slide in the slide storage unit based on the data value, the address value "Address," the length "Length," and the matching flag FLAG, and decodes code data. The decoded data is supplied to a data writing unit 403 and written in the program area 210A of the main memory 210.

<Details of a Decoding Process>

Figure 13:
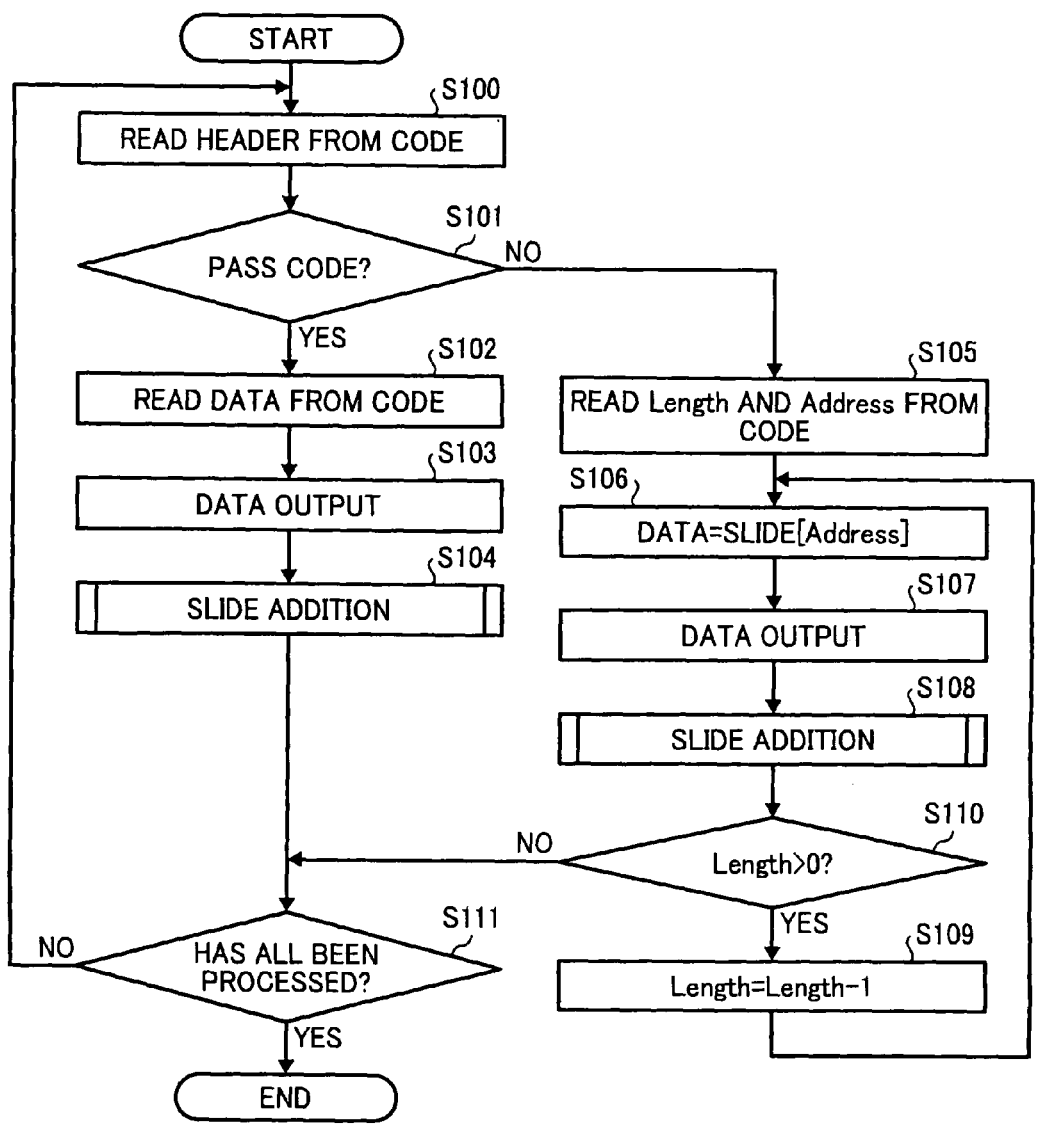
FIG. 13 is an example of a flowchart illustrating a decoding process of a decoder.

FIG. 13 is a flowchart illustrating an example of a process of decoding code data encoded by the encoding method of the present embodiment through the decoder 243. It is assumed that code data is already read from the flash memory 240 by the code reading unit 400. First, in step S100, the code format analyzing unit 401 reads a header of compression data read into the code reading unit 400 and determines whether a subsequent code is the PASS code or the slide code (step S101).

When the header, that is, the value of the matching flag FLAG is "0," it is determined that the code having the corresponding header is the PASS code, and the process proceeds to step S102. In step S102, the code format analyzing unit 401 reads in eight bits subsequent to the header as a data value. The data value is output as output data "as is" (step S103) and supplied to the slide expanding unit 402 to be added to the slide (step S104). The process of adding the data value to the slide is performed by the same procedure as described above in the flowchart of FIG. 10. Then, the process proceeds to step S111.

In step S111, it is determined whether or not processing has been completed on all of code data read into the code reading unit 400. When it is determined that it has been completed on all of code data, a series of decoding processes are ended. However, when it is determined that processing has not been completed on all of code data read into the code reading unit 400 yet, the process returns to step S100, and the process is performed on a next code.

When it is determined in step S101 that the read header is not the PASS code but the slide code, the process proceeds to step S105. In step S105, the code format analyzing unit 401 reads sixteen bits subsequent to the header as the length "Length" and the address value "Address." The length "Length" and the address value "Address" are supplied to the slide expanding unit 402.

In step S106, the slide expanding unit 402 reads the data stored in the slide, represented by the address value "Address" of the slide storage unit. The read data is output as output data (step S107) and also supplied to the slide expanding unit 402 to be added to the slide (step S108).

The process proceeds to step S110, and it is determined whether the length "Length" is larger than "0." When it is determined that the length "Length" is equal to or less than "0," the process proceeds to step S111. However, when it is determined that the length "Length" is larger than "0", the process returns to step S106.

<Hardware Configuration of the Slide Expanding Unit>

Figure 14:
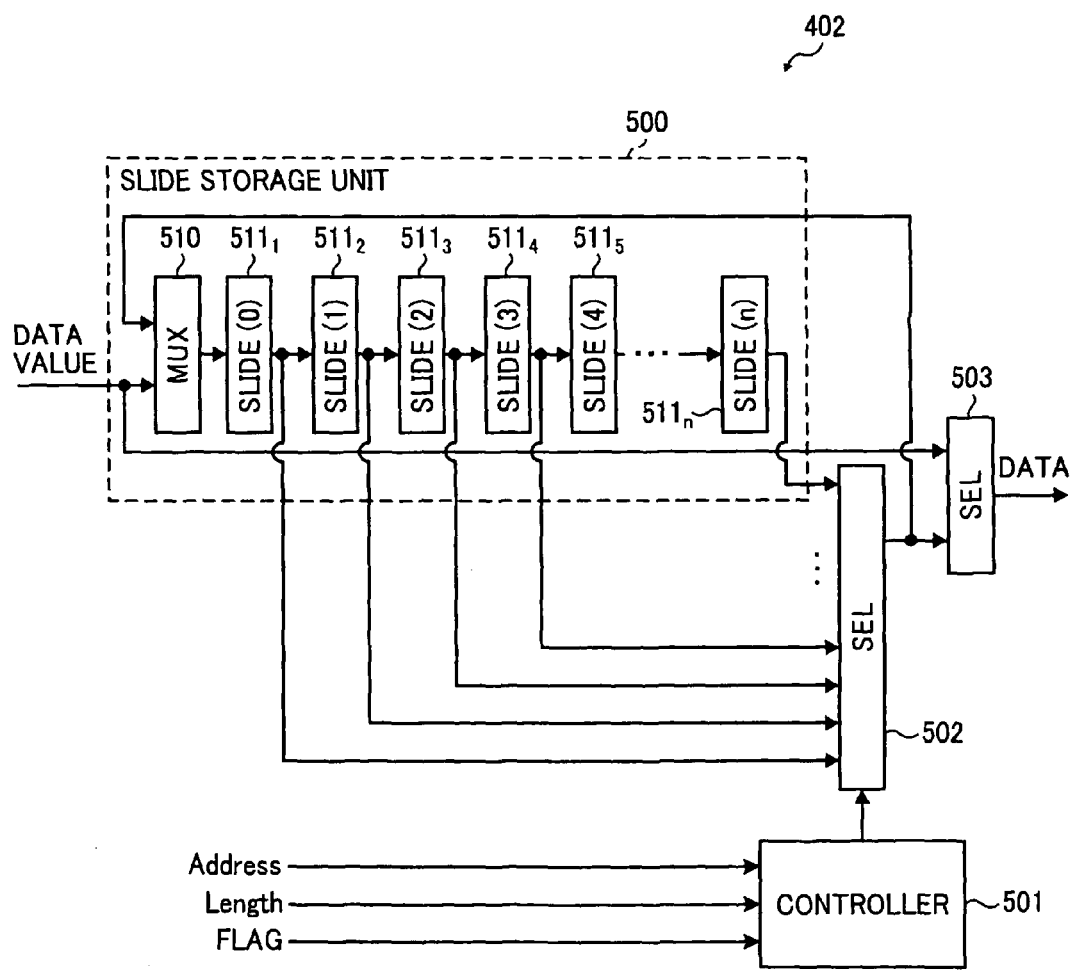
FIG. 14 is a circuit diagram illustrating an example of a hardware configuration of a slide expanding unit.
Figure 15:
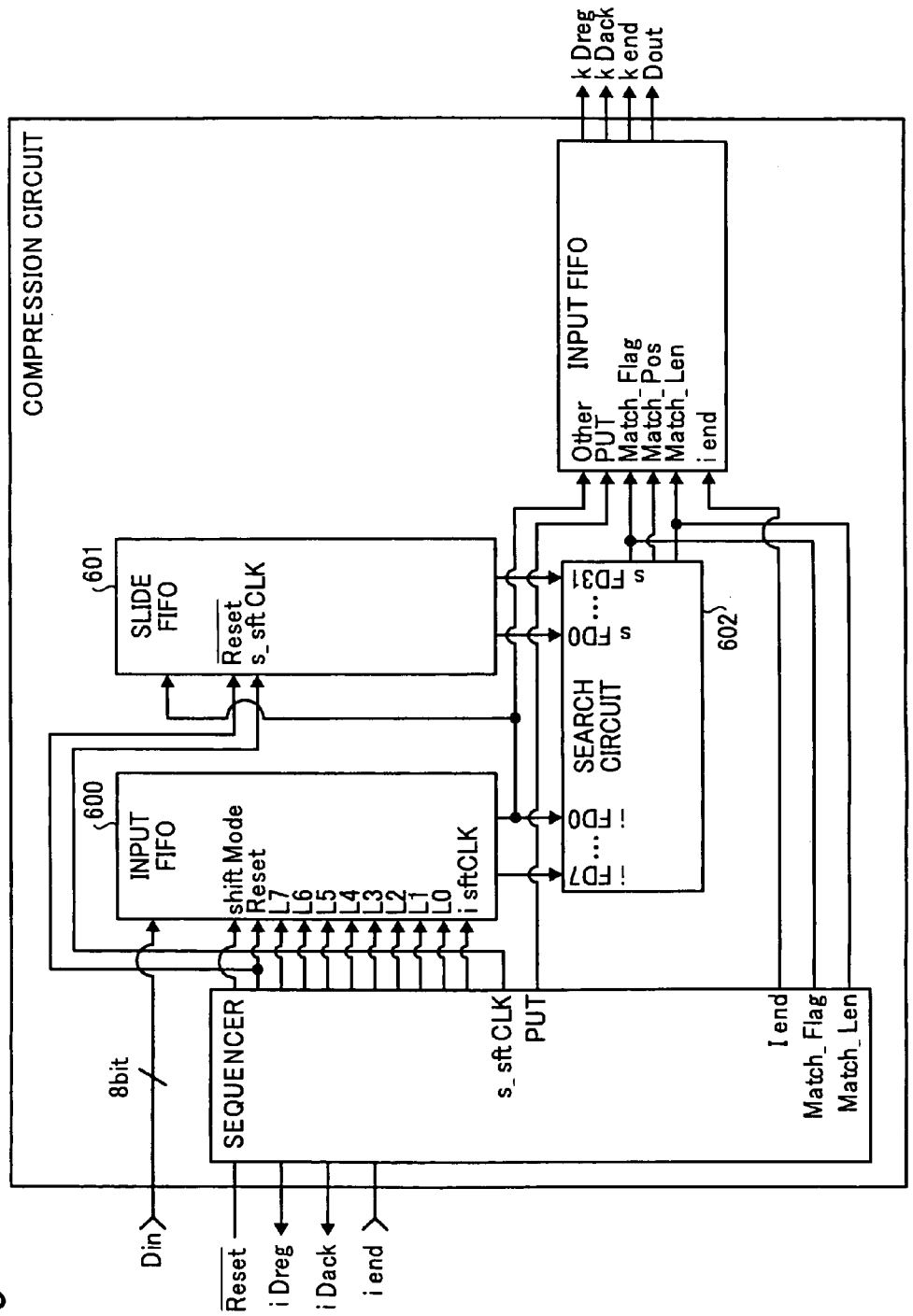
FIG. 15 is a block diagram illustrating an example of a configuration of an encoding device according to a conventional technique.
Figure 16:
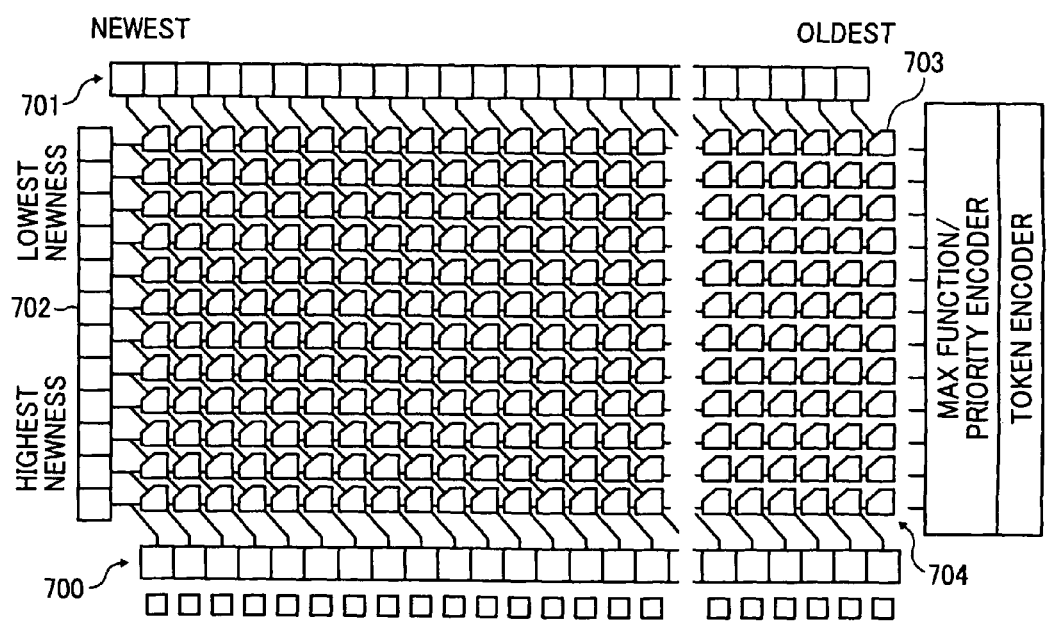
FIG. 16 is a block diagram illustrating an example of a configuration of an encoding device according to a conventional technique.

FIG. 14 illustrates an exemplary hardware configuration of the slide expanding unit 402. The slide expanding unit 402 includes a slide storage unit 500, a controller 501, and selectors 502 and 503.

The controller 501 includes, for example, a microcontroller. The controller 501 receives the address value "Address," the length "Length," and the matching flag FLAG and controls an overall operation of the slide expanding unit 402 based on the received data. For example, the controller 501 controls the process of adding the data value to the slide in the slide storage unit 500 or operations of the selectors 502 and 503.

The slide storage unit 500 includes: a FIFO configuration with n slides $511_1, 511_2, \ldots,$ and $511_n$ which are connected in series and which each include a register and stores data of one unit; and a selector 510 connected to the front of the FIFO configuration.

Outputs of the slides $511_1, 511_2, \ldots,$ and $511_n$ are supplied to the selector 502. An output of the selector 502 is supplied to the selector 503 and also supplied to the selector 510.

The data value read from the code format analyzing unit 401 is supplied to the selector 510 and also supplied to the selector 503. The selector 510 adds the input data value to the slide $511_1$ at the time of the slide adding process in step S104 of FIG. 13. Further, at the time of the slide adding process in step S104 of FIG. 13, data output from the slide selected based on the address value "Address" of the slide code in step S106 is added to the slide $511_1$.

At the process in step S106 of FIG. 13, the selector 502 selects an output of the slide $511_{Address}$ from outputs of the slides $511_1, 511_2, \ldots,$ and $511_n$ of the slide storage unit 500 based on the address value "Address" supplied from the controller 501 and supplies the selected output to the selectors 503 and 510.

In step S103 of FIG. 13, the selector 503 outputs the data value read in step S102. Further, at the time of the data output process in step S107 of FIG. 13, the selector 503 outputs the data supplied from the selector 502.

The present invention has been described above to be applied to the printer device as one example, but the present invention is not limited thereto. That is, the present invention may be applied to any other device that performs lossless encoding of data using hardware.

According to the present invention, an encoding process is able to be performed at a higher speed with a small-scale hardware configuration.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A data processing apparatus, comprising:
a slide storage unit that sequentially stores input data input from a first terminal of the slide storage unit and sequentially slides stored data toward a second terminal of the slide storage unit upon each input;
a first comparing unit that compares the input data input from the first terminal with each of the stored data in the slide storage unit in parallel and obtains a position of matching data of the stored data in the slide storage unit that matches the input data;
a first determining unit that determines whether or not at least one of the stored data in the slide storage unit matches the input data compared by the first comparing unit based on a result of the comparison by the first comparing unit;
a second comparing unit that compares the input data input from the first terminal with each of the stored data in the slide storage unit in parallel and obtains a position of matching data of the stored data in the slide storage unit that matches the input data;
a second determining unit that determines whether or not at least one of the stored data in the slide storage unit matches the input data compared by the second comparing unit based on a result of the comparison by the second comparing unit;
a holding unit that holds the result of the comparison by the first or second comparing unit based on results of the determinations by the first and the second determining units;
an address value generating unit that generates an address value representing the position of the matching data based on the result of the comparison by the first or second comparing unit that is held by the holding unit according to the result of the determination by the second determining unit;
a length value generating unit that obtains a longest length of a matching data list of the store data in the slide storage unit that match the input data compared by the second comparing unit and that is at positions in the slide storage unit consecutive over each input of the input data to the slide storage unit, and generates a length value representing the longest length, according to the result of the determination by the second determining unit;
a data value generating unit that generates a data value that uses the input data as is according to the results of the determinations by the first and second determining units; and
a code generating unit that generates a code including the address value, the length value, and the data value,
wherein the comparison by the second comparing unit of comparing each of the stored data in the slide storage unit with the input data input from the first terminal is controlled based on the result of the comparison by the first or second comparing unit held in the holding unit.

2. The data processing apparatus according to claim 1, wherein the address value generating unit obtains the longest length for one of matching data lists matching the input data compared by the second comparing unit that is nearest to the first terminal of the slide storage unit.

3. The data processing apparatus according to claim 1, wherein the holding unit holds:

the result of the comparison by the first comparing unit if the first determining unit determines that none of the stored data in the slide storage unit matches the input data compared by the first comparing unit; and the result of the comparison by the second comparing unit if the first determining unit determines that at least one of the stored data in the slide storage unit matches the input data compared by the first comparing unit or if the second determining unit determines that at least one of the stored data in the slide storage unit matches the input data compared by the second comparing unit.

4. The data processing apparatus according to claim 1, wherein the address value generating unit generates the address value at least when the second determining unit determines that all of the stored data in the slide storage unit do not match the input data compared by the second comparing unit.

5. The data processing apparatus according to claim 1, wherein the length value generating unit generates the length value at least when the second determining unit determines that all of the stored data in the slide storage unit do not match the input data compared by the second comparing unit.

6. The data processing apparatus according to claim 1, wherein the data value generating unit generates the data value when the first determining unit determines that all of the stored data in the slide storage unit do not match the input data compared by the first comparing unit and the second determining unit determines that all of the stored data in the slide storage unit do not match the input data compared by the second comparing unit.

7. The data processing apparatus according to claim 1, wherein the second comparing unit is controlled not to perform the comparison if the result of the comparison by the first or second comparing unit held in the holding unit indicates that all of the stored data in the slide storage unit do not match the input data compared.

8. The data processing apparatus according to claim 1, wherein the slide storage unit stores the input data per byte.

9. A data processing method, comprising:

first comparing of comparing input data input from a first terminal of a slide storage unit that sequentially stores the input data and sequentially slides stored data toward a second terminal of the slide storage unit upon each input, with each of the stored data in the slide storage unit in parallel and obtaining a position of matching data in the slide storage unit that matches the input data;

first determining of determining whether or not at least one of the stored data in the slide storage unit matches the input data compared in the first comparing based on a result of the comparison in the first comparing;

second comparing of comparing the input data input from the first terminal of the slide storage unit with each of the stored data in the slide storage unit in parallel and obtaining a position of matching data in the slide storage unit that matches the input data;

second determining of determining whether or not at least one of the stored data in the slide storage unit matches the input data compared in the second comparing based on a result of the comparison in the second comparing;

holding the result of the comparison in the first or second comparing in a holding unit, based on results of the determinations in the first determining and the second determining;

generating an address value representing the position of the matching data based on the result of the comparison by the first or second comparing held in the holding unit according to the result of the determination in the second determining;

obtaining a longest length of a matching data list of the stored data in the slide storage unit that match the input data compared in the second comparing and that is at positions in the slide storage unit consecutive over each input of the input data to the slide storage unit, and generating a length value representing the longest length, according to the result of the determination in the second determining;

generating a data value that uses the input data as is according to the results of the determinations in the first determining and the second determining; and generating a code including the address value, the length value, and the data value, wherein the comparing of each of the stored data in the slide storage unit with the input data input from the first terminal of the slide storage unit is controlled based on the result of the comparison in the first or second comparing held in the holding unit.

\* \* \* \* \*